(12) United States Patent  
Su et al.

(10) Patent No.: US 8,451,041 B2  
(45) Date of Patent: May 28, 2013

(54) CHARGE-INJECTION SENSE-AMP LOGIC

(75) Inventors: Jason T. Su, Los Altos, CA (US); Winston Lee, Palo Alto, CA (US); Yuntian Chen, San Francisco, CA (US)

(73) Assignee: Marvell World Trade Ltd., St. Michael (BB)

( * ) Notice: Subject to any disclaimer, the term of this patent is extended or adjusted under 35 U.S.C. 154(b) by 38 days.

(21) Appl. No.: 13/184,836

(22) Filed: Jul. 18, 2011

(65) Prior Publication Data

US 2012/0013379 A1     Jan. 19, 2012

Related U.S. Application Data

(60) Provisional application No. 61/365,241, filed on Jul. 16, 2010.

(51) Int. Cl.  
*H03K 3/356*     (2006.01)

(52) U.S. Cl.  
USPC ........................................... 327/211

(58) Field of Classification Search  
USPC .................. 327/199–201, 208–215, 218  
See application file for complete search history.

(56) References Cited

U.S. PATENT DOCUMENTS

| | | | |
|---|---|---|---|
| 6,043,696 A | 3/2000 | Klass et al. | |
| 6,717,448 B2* | 4/2004 | Heo et al. | 327/202 |
| 7,304,508 B1 | 12/2007 | Yang et al. | |
| 2005/0127950 A1 | 6/2005 | Ngo | |

FOREIGN PATENT DOCUMENTS

WO    WO 98/06177    2/1998

OTHER PUBLICATIONS

The International Search Report and Written Opinion for corresponding International Application No. PCT/US2011/044367, mailed Nov. 21, 2011; 17 pages.

* cited by examiner

*Primary Examiner* — Lincoln Donovan  
*Assistant Examiner* — Sibin Chen

(57) ABSTRACT

A flip-flop circuit includes a charge injection module, a sense amp module, and a latch module. The charge injection module is configured to, in response to a clock signal, selectively provide electrical charge from a power supply to a first node. The sense amp module is configured to adjust a voltage of a second node in response to detecting a voltage of the first node crossing a threshold while the charge injection module is providing the electrical charge to the first node. The latch module is configured to in response to the clock signal, store a value based on a voltage of the second node. The latch module is also configured to provide the value as an output of the flip-flop circuit.

18 Claims, 15 Drawing Sheets

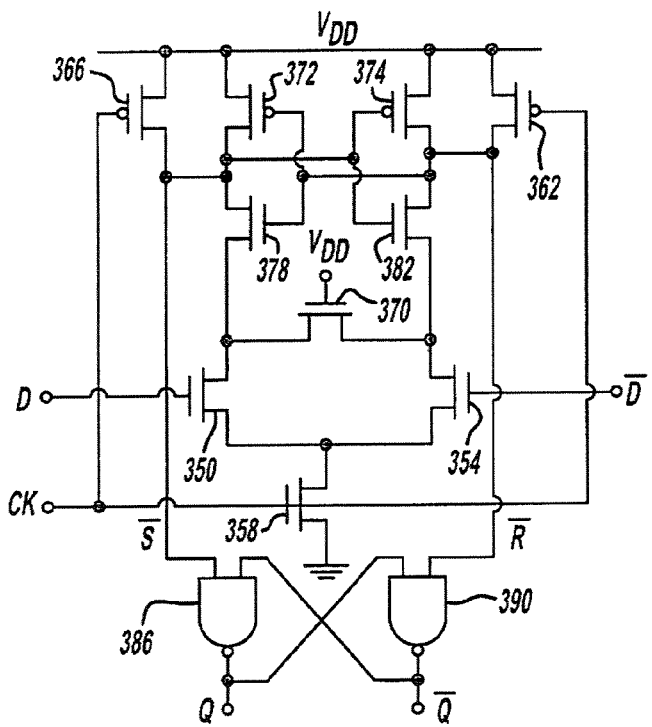
FIG - 2D
Prior Art
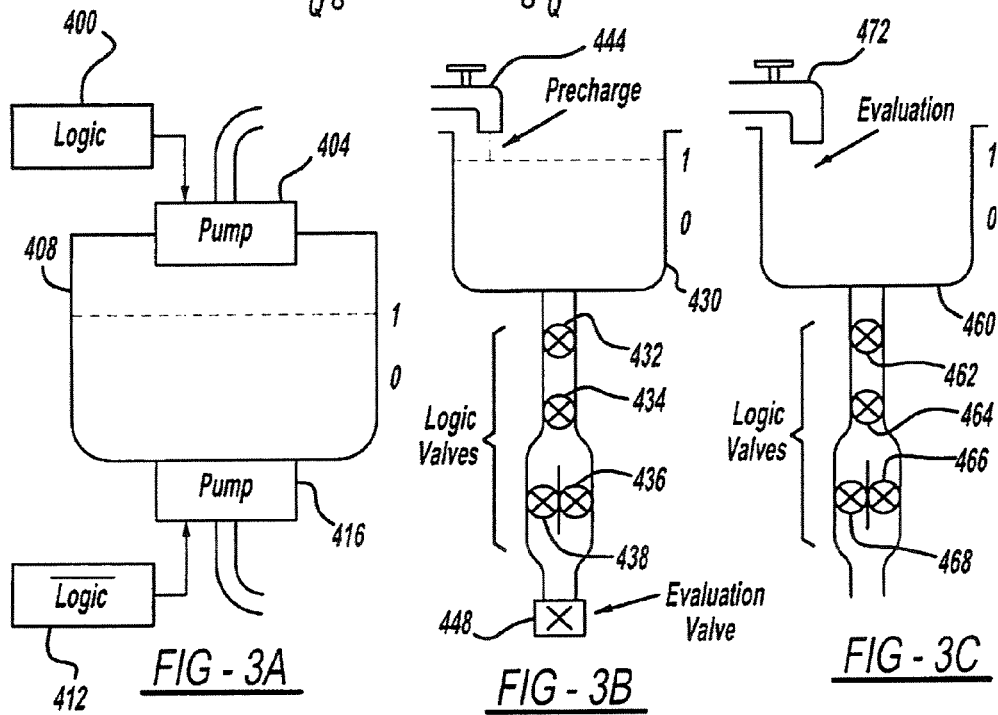
FIG - 3A
FIG - 3B
FIG - 3C

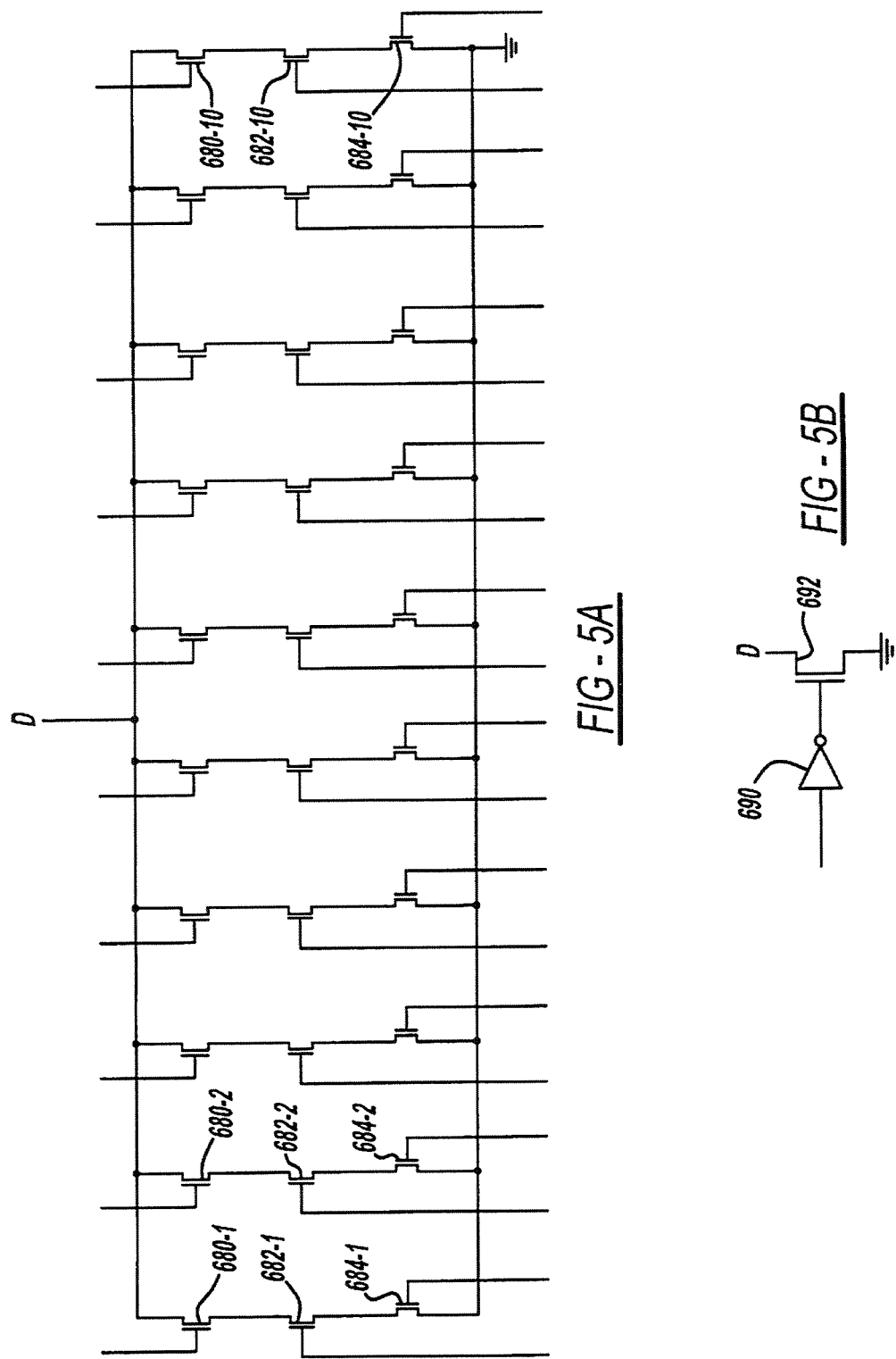

US 8,451,041 B2

CHARGE-INJECTION SENSE-AMP LOGIC

CROSS-REFERENCE TO RELATED APPLICATIONS

This application claims the benefit of U.S. Provisional Application No. 61/365,241 filed on Jul. 16, 2010. The disclosure of the above application is incorporated herein by reference in its entirety.

FIELD

The present disclosure relates to semiconductor latches and more particularly to charge-injection sense-amp logic.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Referring, now to FIG. 1A, a high level functional block diagram of synchronous logic is presented. One or more inputs are received by logic 100. The logic 100 may include combinational logic, such as an arrangement of logic gates. The logic 100 may have one or more outputs, one of which is shown being received by a flip-flop 104. Based on a received clock signal CK, the flip-flop 104 latches the value of the output from the logic 100. This latch value is then presented at an output of the flip-flop 104.

When the logic 100 has more than one output, flip-flops, including the flip-flop 104, may be used. In a pipelined system, one or more flip-flops may be present between each stage of the pipeline. In such an example. FIG. 1A may represent one stage of the pipeline, where the inputs to the logic 100 are received from flip-flops of the previous stage, and the output of the flip-flop 104 is provided to logic in the subsequent stage of the pipeline.

Referring now to FIG. 1B, a circuit diagram of a combinational logic is presented. For example, the components of FIG. 1B could be included in the logic 100 of FIG. 1A. A metal oxide semiconductor field-effect transistor (MOSFET) 110 includes a gate that receives input A1. A MOSFET 114 includes a gate that receives an input signal A2. The input signal A1 is also received by a gate of a MOSFET 118, while the input signal A2 is also received by a gate of a MOSFET 122.

Sources of the MOSFETs 118 and 122 are connected to a power supply $V_{DD}$. The MOSFETs 110 and 114 are connected in series; a source of the MOSFET 114 is connected to a ground potential and a drain of the MOSFET 110 is connected to sources of the MOSFETs 118 and 122. The drain of the MOSFET 110 is provided as an output, labeled D. The output D is the logical NAND (NOT AND) of the inputs A1 and A2. The MOSFETs 110 and 114 are N-channel MOSFETs, while the MOSFETs 118 and 122 are P-channel MOSFETs.

Referring now to FIG. 2A, a functional schematic of a master-slave flip-flop is presented. For example only, the flip-flop of FIG. 2A may be used as the flip-flop 104 of FIG. 1A. FIGS. 2A and 2B are examples of flip-flops using principles of static logic. Logic signal D is received at first terminals of a MOSFET 140 and a MOSFET 144. Second terminals of the MOSFETs 140 and 144 are connected to an input of an inverter 148. An output of the inverter 148 is connected to an input of an inverter 152. An output of the inverter 152 is connected to the input of the inverter 148. A master portion 156 of the flip-flop includes the MOSFETs 140 and 144 and the inverters 148 and 152.

A slave portion 160 of the flip-flop receives an output of the inverter 148 at first terminals of MOSFETs 164 and 168. Second terminals of the MOSFETs 164 and 168 are connected to an input of an inverter 172. An output of the inverter 172 is connected to an input of an inverter 176. An output of the inverter 176 is connected to the input of the inverter 172. The output of the inverter 172 is output from the flip-flop and is, according to convention, labeled Q. A clock signal CK is received by gates of the MOSFETs 144 and 164. An inverter 180 provides an inverted version of the clock signal CK to gates of the MOSFETs 140 and 168.

The MOSFETs 140 and 164 are N-channel MOSFETs, while the MOSFETs 144 and 168 are P-channel MOSFETs. Together, the MOSFETs 140 and 144 form a pass gate, which is controlled by the clock signal CK. Similarly, the MOSFETs 164 and 168 also form a pass gate. When the clock signal CK is low, the input signal D is passed through the pass gate formed by the MOSFETs 140 and 144 and is buffered and inverted by the inverters 148 and 157.

When the clock signal transitions to high, the pass gate formed by the MOSFETs 164 and 168 connects the output of the master portion 156 to the inverters 172 and 176. At the same time, the pass gate formed by the MOSFETs 140 and 144 begins blocking the signal D so that changes to the signal D are not reflected at the output of the master portion 156. The output of the inverter 172, Q, therefore holds the value of D captured at the previous rising edge of the clock CK. When the clock signal CK falls, the pass gate formed by the MOSFETs 164 and 168 blocks signals from the output of the master portion 156, and the value of Q is therefore retained until the clock signal CK rises once again.

The inverters 148, 152, 172, and 176 may share a similar structure. For example only, the structure may include an N-channel MOSFET and a P-channel MOSFET in series, where the inverter input is connected to gates of the MOSFETs and where the inverter output is connected to the de between the MOSFETs.

Referring now to FIG. 2B, another implementation of a master slave flip-flop is shown. A clock signal CK and an inverted clock signal generated by an n 200 are received by gates of MOSFET 204 and MOSFET 208, respectively. An input D is received by first terminals of the MOSFETs 204 and 208, and second terminals of the MOSFETs 204 and 208 are connected to an inverter 212, which is connected in series with an inverter 216. An output of the inverter 216 is connected to the input of the inverter 212 via a pass gate formed by MOSFETs 220 and 224. Gates of the MOSFETs 220 and 224 receive the clock signal CK and the inverted clock signal, respectively.

The output of the inverter 216 is provided to an inverter 228 via a pass gate formed by MOSFETs 232 and 236. Gates of the MOSFETs 232 and 236 receive the clock signal CK and the inverted clock signal, respectively. The inverter 240 receives an output from the inverter 228 and outputs a signal to the input of the inverter 128 via a pass gate formed by MOSFETs 244 and 248. Gates of the MOSFETs 244 and 248 receive the inverted clock signal and the clock signal, respectively. The output of the inverter 240 is labeled Q. In comparison to FIG. 2A, FIG. 2B includes two additional pass gates. The pass gate formed by the MOSFETs 220 and 224 enables the inverters 212 and 216 to create a loop that retains the values of the input of the inverter 212 and the output of the inverter 216.

Referring now to FIG. 2C, a flip-flop using dynamic principles is presented. A clock signal CK is received by a gate of a MOSFET 280 and by an inverter 284. An output of the inverter 284 is received by an inverter 288, which provides an output to a NAND gate 292. The clock signal CK is also received by MOSFETs 296 and 300. Input signal D is received by MOSFET 304. A source of the MOSFET 296 is connected to a power supply $V_{DD}$, and a source of the MOSFET 280 is connected to a ground potential. A MOSFET 308 is connected in series between the MOSFETs 296 and 304, while the MOSFET 304 is connected in series between the MOSFETs 308 and 280.

A gate of the MOSFET 308 receives an output of the NAND gate 292. The node between the MOSFETs 296 and 308 is connected to a second input of the NAND gate 292, an input of an inverter 312, and gates of MOSFETs 316 and 320. An output of the inverter 312 is provided to an input of an inverter 324. An output of the inverter 324 is tied back to the input of the inverter 312.

A source of the MOSFET 316 is connected to ground, while a source of the MOSFET 320 is connected to $V_{DD}$. The MOSFET 300 is connected in series between the MOSFETs 320 and 316. The node between the MOSFETs 320 and 300 is connected to an input of an inverter 328. An output of the inverter 328 is connected to the input of the inverter 332, while an output of the inverter 332 is tied back to the input of the inverter 328. The output of the inverter 332 is labeled as the output Q, while the output of the inverter 328 is a logical complement of Q, labeled $\overline{Q}$. While FIGS. 2A and 2B depict static logic, where input signals are simply latched by inverter feedback loops that are selectively connected to each other via pass gates, the dynamic logic FIG. 2C relies on evaluation of a dynamic node. The output of the inverter 324 and the input of the inverter 312 are connected to the dynamic node, and the voltage on the dynamic node is affected by the input signal D. By latching a result as the output Q based on the dynamic node, the value of the input signal is thereby determined and latched.

Referring now to FIG. 2D, another example of a flip-flop is presented. Input D is received by a gate of a MOSFET 350, while a logical complement of the input D is received by a gate of a MOSFET 354. A MOSFET 358 selectively connects sources of the MOSFETs 350 and 354 to a ground potential. Gates of the MOSFET 358 and MOSFETs 362 and 366 are controlled by a clock signal CK. The sources of the MOSFETs 362 and 366 are connected to $V_{DD}$. A MOSFET 370 has a gate connected to $V_{DD}$ and is connected between drains of the MOSFETs 350 and 354.

Sources of MOSFETs 372 and 374 are connected to $V_{DD}$. A MOSFET 378 is connected in series between the MOSFETs 372 and 350. A MOSFET 382 is connected in series between the MOSFETs 354 and 374. Gates of the MOSFETs 372 and 378 are connected to the node between the MOSFETs 374 and 382. Similarly, the gates of the MOSFETs 374 and 382 are connected to the node between the MOSFETs 372 and 378.

The node between the MOSFETs 372 and 378 is connected to the drain of the MOSFET 366 and to a first input of a NAND gate 386. The node between the MOSFETs 374 and 382 is connected to a drain of the MOSFET 362 and to a first input of a NAND gate 390. A second input of the NAND gate 386 is connected to an output of the NAND gate 390. Similarly a second input of the NAND gate 390 is connected to an output of the NAND gate 386.

As a result, the NAND gates 386 and 390 form a set-reset (SR) latch, and the first inputs to the NAND gates 386 and 390 are labeled $\overline{S}$ and $\overline{R}$, respectively. The output of the NAND gate 386 is Q, while the output of the NAND gate 390 is the logical complement, labeled $\overline{Q}$. In FIG. 2D, the flip-flop operates similarly to a differential amplifier having inputs of the input signal D and its logical complement. The outputs of the differential amplifier are labeled $\overline{S}$ and $\overline{R}$, and are connected as set and reset signals, respectively, to an SR latch. The differential amplifier therefore controls the SR latch to output the appropriate signal Q in response to the input signal D.

SUMMARY

A flip-flop circuit includes a charge injection module, a sense amp module, and a latch module. The charge injection module is configured to in response to a clock selectively provide electrical charge from a power supply to a first node. The sense amp module is configured to adjust a voltage of a second node in response to detecting a voltage of the first node crossing a threshold while the charge injection module is providing the electrical charge to the first node. The latch module is configured to in response to the clock signal, store a value based on a voltage of the second node. The latch module is also configured to provide the value as an output of the flip-flop circuit.

In other features, the flip-flop circuit further includes an injection control module configured to generate an injection enable signal in response to the clock signal. The charge injection module is configured to in response to generation of the injection enable signal, provide the electrical charge to the first node. The injection control module is configured to stop generating the injection enable signal in response to the second node reaching a predetermined state. The sense amp module includes a feedback module configured to generate a feedback signal, where the injection control module is configured to stop generating the injection enable signal in response to generation of the feedback signal. The sense amp module includes a clock gating module configured to selectively generate a gated clock signal in response to the clock signal and a feedback signal, and an isolation module configured to selectively connect the second node to the first ode in response to the gated clock signal.

In still other features, the sense amp module includes a second node adjustment module configured to connect the second node to a second power supply in response to the voltage of the second node decreasing below the threshold. The sense amp module includes a feedback module configured to selectively generate a feedback signal. The charge injection module is configured to stop providing the electrical charge to the charge storing node when either the feedback signal is generated or the voltage of the second node falls below the threshold. The feedback module is configured to suspend generation of the feedback signal when the voltage of the second node falls below the threshold. The latch module is configured to store the value corresponding to the signal at the second node in response to a predetermined edge of a delayed version of the clock signal, where the predetermined edge is one of a rising edge and a falling edge.

In further features, a circuit includes the flip-flop circuit and combinational logic that selectively creates a low-resistance path between the first ode and a second power supply in response to at least one input signal. A voltage of the second power supply is less than a voltage of the power supply.

A method of operating flip-flop circuit includes in response to a clock signal, selectively providing electrical charge from a power supply to a first node. The method further includes adjusting a voltage of a second node in response to detecting a voltage of the first node crossing a threshold while the electrical charge is being provided to the first node. The method further includes, in response to the clock signal, storing a value based on a voltage of the second node. The method further includes providing, the value as an output of the flip-flop circuit.

Further areas of applicability of the present disclosure will become apparent from the detailed description the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 2D is a circuit diagram of another example of a flip-flop according to the prior art;

FIGS. 3A-3C are illustrations of fluid-based analogies used to describe various types of flip-flop designs;

FIG. 5A is a circuit diagram of an example of combinational logic;

FIG. 5B is a circuit diagram of a simplified combinational logic circuit;

DESCRIPTION

Figure 1A:
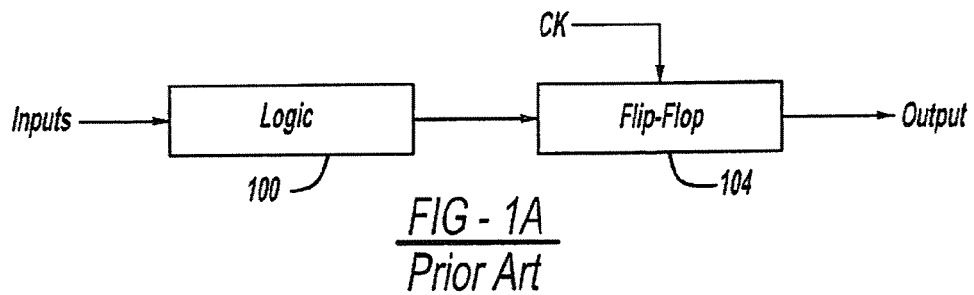
FIG. 1A is a high level functional block diagram of synchronous logic according to the prior art.

The following description is merely illustrative in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip.

Flip-flops are important building blocks in many digital integrated circuits. A large number of flip-flops may be used in any given design. For example, a pipelined structure may require a set of flip-flops, including a flip-flop for every bit processed, for each pipeline stage. The parameters of the flip-flops may therefore significantly impact the parameters of the overall device. For example, overall area, speed, power dissipation, and noise tolerance of the device may all be affected by the corresponding parameter of the flip-flop.

Figure 4A:
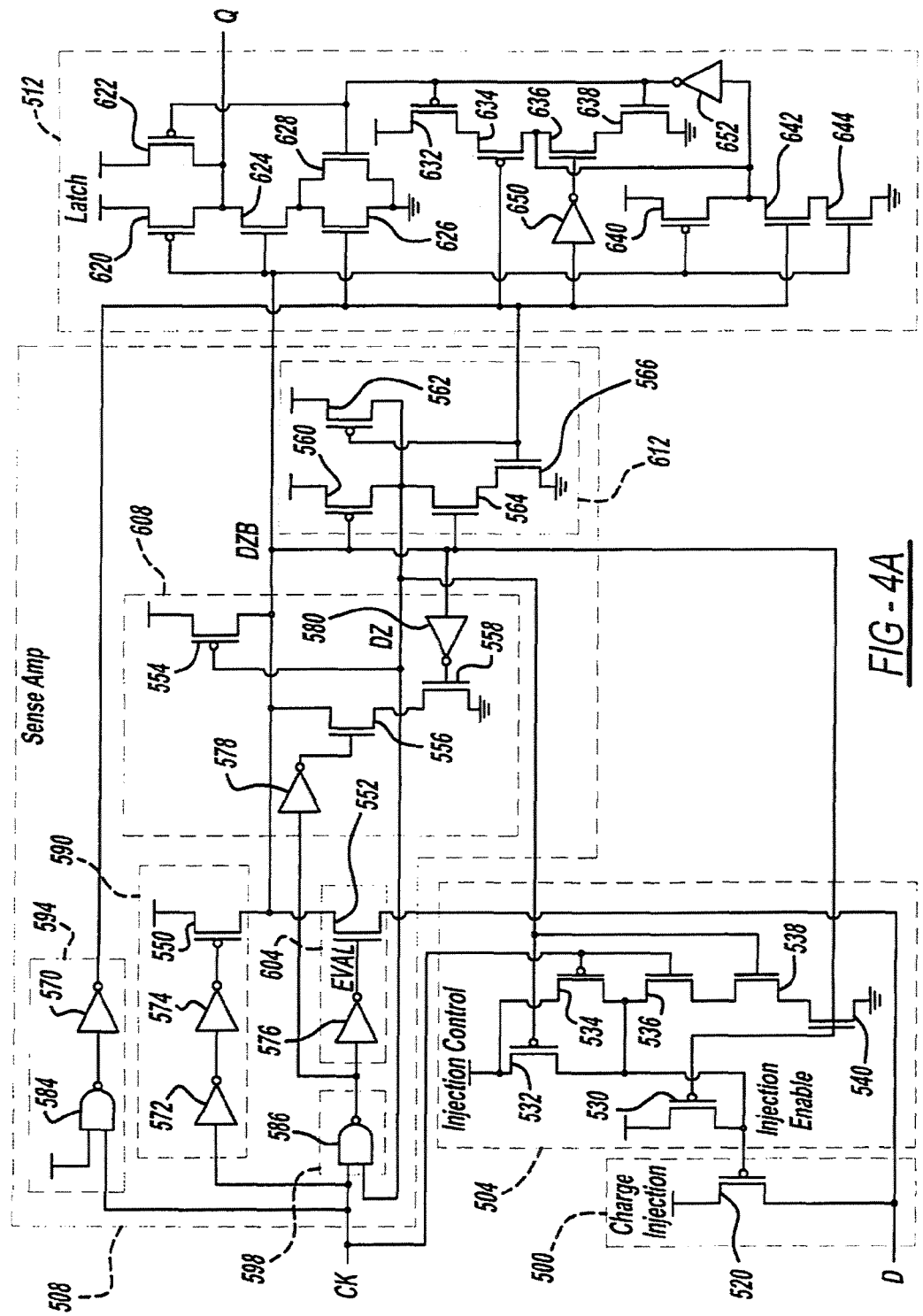
FIG. 4A is a circuit diagram of an example of an implementation of evaluation and sensing circuitry.
Figure 4B:
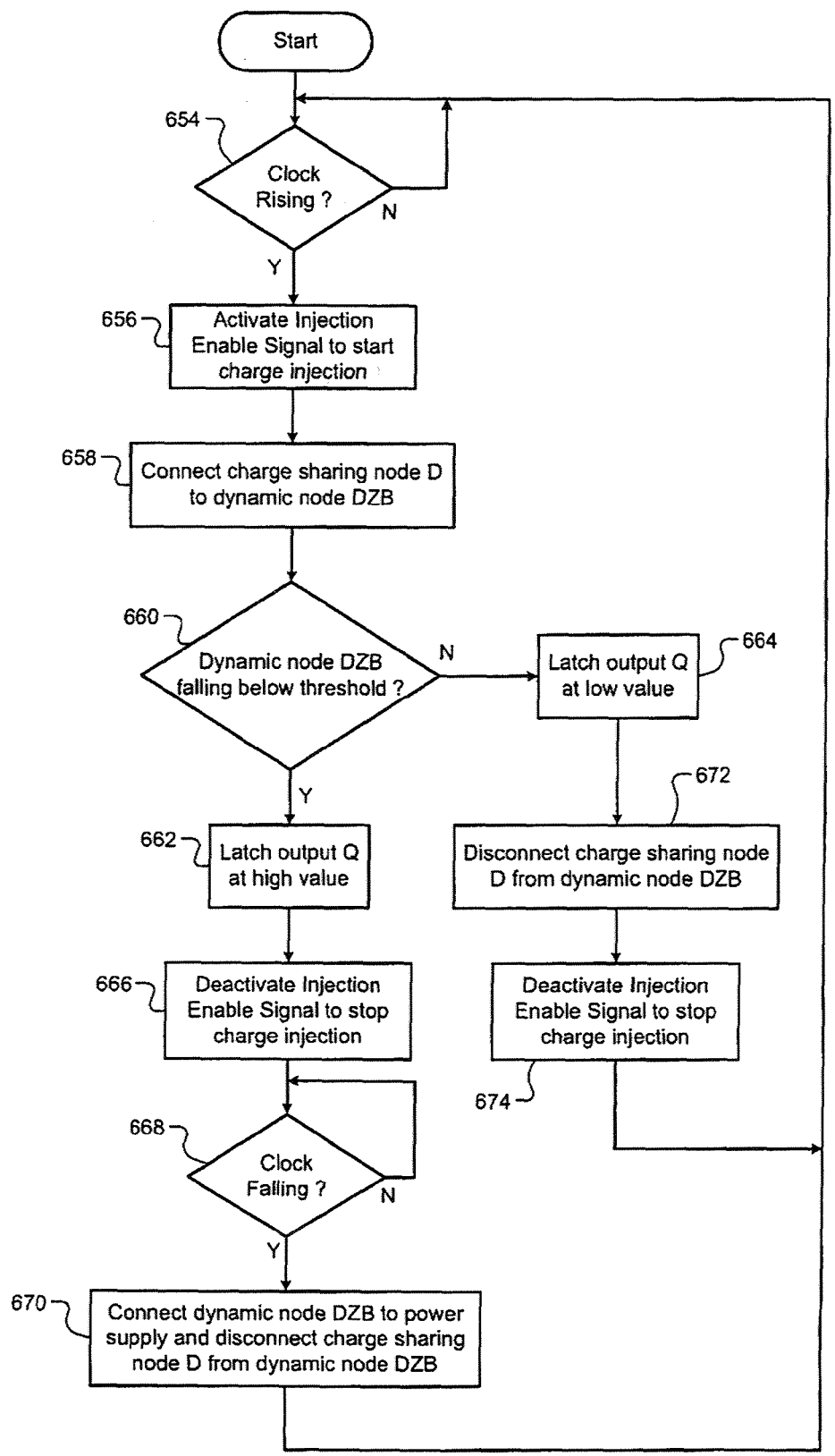
FIG. 4B is a flowchart depicting an example of operation of a charge injection flip-flop.

When compared to static logic and dynamic logic, charge-injection sensing logic of the present disclosure may have better parameters, such as smaller area and/or less power. FIGS. 3A-3C present high-level analogies for operation of static, dynamic, and charge-injection logic. FIG. 4A is an example of a flip-flop implementing charge-injection logic and FIG. 4B is an example of operation of the flip-flop of FIG. 4A. FIG. 5 is an example of combinational logic that can be placed at the input of the flip-flop of FIG. 4A. FIGS. 6 and 7 depict operation of an implementation of the flip-flop of FIG. 4A. FIGS. 8-10 present alternative implementations of flip-flops and combinational logic based on a common truth table. FIG. 11 presents an empirical comparison of simulations of the circuits presented in FIGS. 8-10.

Referring now to FIGS. 3A-3C, a fluid analogy is used to describe various types of flip-flop designs. As with any analogy, the relationship is only approximate and these analogies are presented for purposes of illustration only. In FIG. 3A, static logic is depicted. Combinational logic 400 (including, for example, logic gates) receives inputs and outputs a digital value. This digital value controls a pump 404. When the digital value is active, the pump 404 pumps fluid into a holding container 408. A high level of fluid in the holding container 408 may correspond to a logic value of one, while a low value of fluid may correspond to a logic value of zero.

A logical complement of the combinational logic 400, $\overline{\text{Logic}}$ 412, controls a second pump 416. When the logical complement of the digital value is active, the second pump 416 pumps fluid out of the holding container 408. Therefore, when the inputs cause the combinational logic 400 to evaluate to an active value, the pump 404 pumps fluid into the holding container and the second pump 416 is disabled, resulting in fluid filling the holding container 408. This corresponds to a value of one. When the inputs cause the combinational logic 400 to evaluate to an inactive value (such as zero in an active-low configuration), the second pump 416 pumps fluid out of the holding container 408 and the pump 404 is disabled. The holding container 408 is therefore emptied of fluid, resulting, a value of zero.

In FIG. 3B, an example corresponding to dynamic principles is shown. A holding container 430 has a drain in which logic valves 432, 434, 436, and 438 are located. Each of the logic valves may correspond to a logic input. The holding container 430 is filled, or pre-charged, by a faucet 444 while an evaluation valve 448 is kept closed. As a result, regardless of whether the logic valves are open or closed, the holding container 430 fills with fluid.

Once the holding container 430 is filled, the faucet 444 is turned off and the evaluation valve 448 is opened. If the logic valves 432, 434, 436, and 438 allow the fluid to drain out of the holding container 430 through the evaluation valve 448, a logic value of zero will result. Otherwise, the pre-charged level of fluid will remain, resulting in a logic value of one. In the example shown in FIG. 3B, the holding container 430 will drain when both the logic valves 432 and 434 are open and at least one of the logic valves 436 and 438 is open. After the evaluation valve 448 has been open for enough time to allow the holding, container 430 to empty, the evaluation valve 448 is once again closed in preparation for the subsequent pre-charge stage.

Referring now to FIG. 3C, a holding container 460 drains through logic valves 462, 464, 466, and 468. The logic valves 462, 464, 466, and 468 may perform similar logical functions to the logic valves 432, 434, 436, and 438 of FIG. 3B. However, in FIG. 3C the evaluation valve 448 may be eliminated. Instead, in an evaluation stage, fluid is added to the holding container 460 through a faucet 472. If the logic valves 462, 464, 466, and 468 do not allow the fluid to leave the holding container, the holding container 460 will fill to the value of logic one. Otherwise, the fluid from the faucet 472 will simply drain out of the holding container 460, keeping the holding container 460 at a logical value of zero.

The evaluation stage ends once enough time has passed that the holding container 460 could have been filled by the faucet 472. The faucet 472 is closed, and the value in the holding container 460 is determined. Subsequently, any fluid that have accumulated may be drained, either through the logic valves or through another mechanism, such as a separate drain valve or a pump, such as the second pump 416. This prepares the holding container 460 for the next evaluation stage. In some implementations, the faucet 472 used to fill the holding container 460 may have a higher rate of flow than the faucet 444. This allows the holding container 460 to fill more quickly to reach the logic value of one, allowing the evaluation stage to be shorter.

By analogy to an electrical system, the fluid corresponds to electrical charge, and transistors or other electric switches take the place of valves. Further, capacitance, which play include discrete capacitors and/or parasitic capacitance, acts as the fluid holding container. Transistors may also function as faucets, providing charge from a power supply. Feedback, which may be used in charge injection logic corresponding to FIG. 3C, may not be readily explained using a water analogy, and therefore is described in more detail below with respect to a circuit schematic.

Although the static logic of FIG. 3A is straightforward, static logic may exhibit higher delays. Dynamic logic, such as is illustrated in FIG. 3B, may have greater power consumption. The charge injection logic of FIG. 3C may have lower power consumption than the dynamic logic of FIG. 3B. In addition, the charge injection logic of FIG. 3C may eliminate the evaluation valve 448, reducing area. The size of the evaluation valve 448 in FIG. 3B may determine how quickly the holding container 430 can be emptied, and therefore the speed of the circuit. As a result, the evaluation valve 448 may require a relatively large area, making in FIG. 3C a significant area savings.

Referring now to FIG. 4A, an implementation of evaluation and sensing circuitry of a flip-flop according, to the principles of the present disclosure is presented. Node D is connected to combinational logic, such as that shown in FIG. 5A or 5B and described below. Node D roughly corresponds to the junction between the holding container 460 and the logic valve 462 of FIG. 3C. A charge injection circuit 500 provides charge to node D, and roughly corresponds to the faucet 472 of FIG. 3C.

The charge injection circuit 500 is controlled by an injection enable signal from an injection control module 504. In the description below, the injection enable signal is an active low signal. A sense amplifier (sense amp) module 508 amplifies the voltage at the node D, and a latch module 512 latches an output from the sense amp module 508. An output of the latch module 512 is shown as Q. In various implementations, the latch module 512 may also output a logic complement of Q.

In the following description, the term MOSFET (metal oxide semiconductor field-effect transistor) is used. However, the present disclosure is not limited to MOSFETs, and other electronic switches, including other types of transistors, can be used. MOSFETs include three terminals, referred to below as gate, source, and drain. However, when other devices are used, these terminals may be referred to as a control terminal, a first terminal, and a second terminal, respectively. MOSFETs may also have a body terminal, which may be tied to the source of the MOSFET. MOSFETs may be N-channel or P-channel, and in the FIGs., P-channel MOSFETs are indicated by a circle adjacent to the gate. Bodies of N-channel MOSFETs may be tied to ground or a negative power supply, such as $V_{SS}$. Similarly, bodies of P-channel MOSFETs may be tied to a positive power supply, such as $V_{DD}$.

Figure 1B:
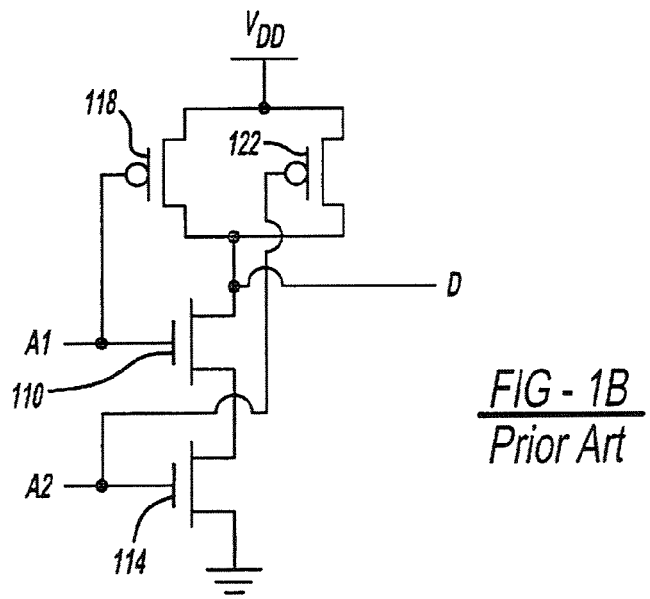
FIG. 1B is a circuit diagram of a combinational logic according to the prior art.
Figure 2A:
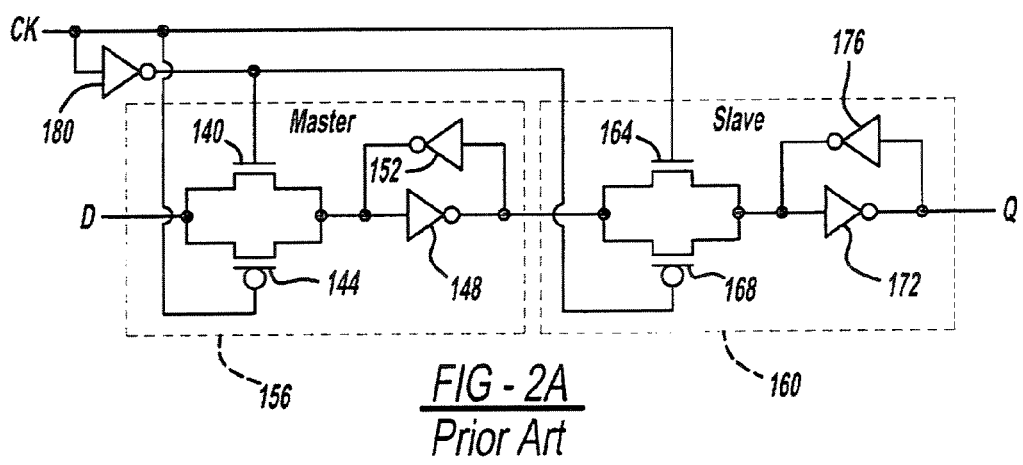
FIG. 2A is a circuit diagram of a master-slave flip-flop according to the prior art.
Figure 2B:
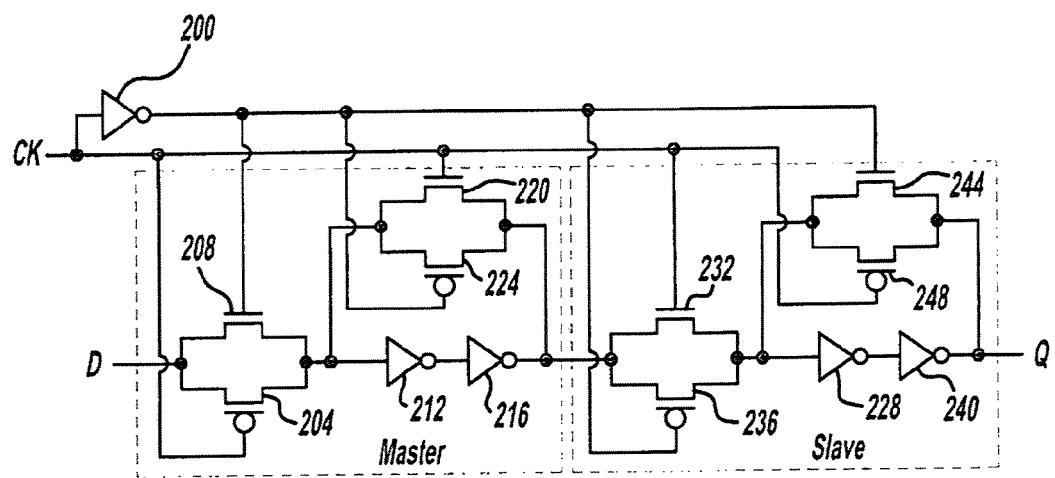
FIG. 2B is a circuit diagram of another implementation of a master slave flip-flop according to the prior art.
Figure 2C:
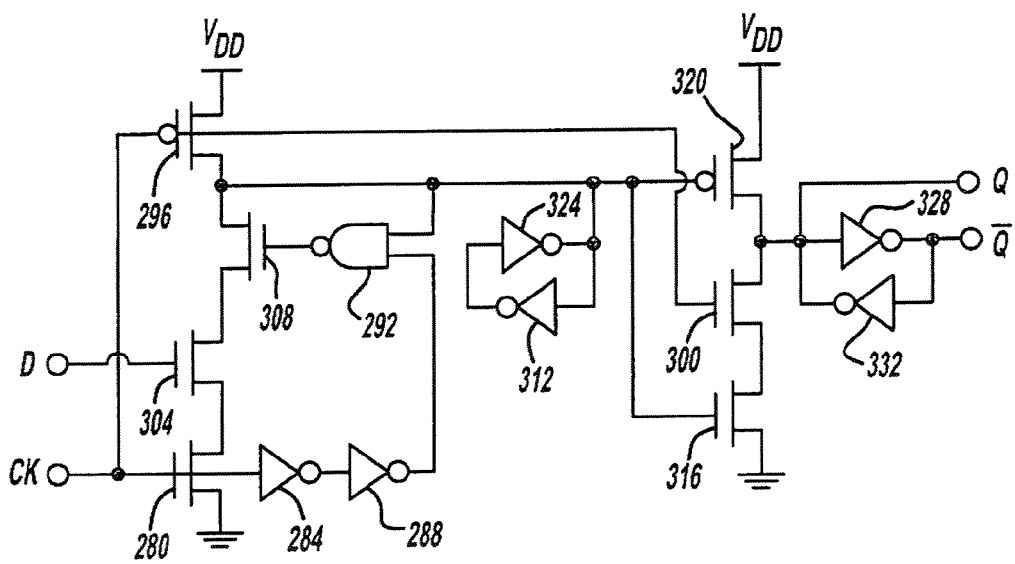
FIG. 2C is a circuit diagram of a flip-flop using dynamic principles according, to the principles of the prior art.

The inverters described below may include an input and an output and be implemented as a series connection between $V_{DD}$ and ground of a P-channel MOSFET and an N-channel MOSFET. In such implementations, the input of the inverter is connected to the gates of the MOSFETS, and the output of the inverter is connected to the node between the MOSFETs. Logic gates, such as NOR gates and NAND gates, may also be implemented using MOSFETs, such as in the NAND gate example of FIG. 1B. Unless otherwise noted, the logic gates described below include an output and first and second inputs, although additional inputs can be implemented.

Except as otherwise indicated, the circuitry below is described as active in which a high voltage is considered to be a value of one (and referred to as high or on), while a low voltage is considered to be a value of zero (and referred to as low or off). The present disclosure is not so limited, and can be used with active low configurations. Further, the following description concerns flip-flops that latch data at the rising edge of the clock. Again, the present disclosure could operate at other times such as at the failing edge of the clock.

The charge injection circuit 500 includes a MOSFET 520. The source of the MOSFET 520 is connected to a power supply, referred to as $V_{DD}$. The drain of the MOSFET 520 is connected to input D. The injection control module 504 includes MOSFETs 530, 532, 534, 536, 538, and 540. The source of the MOSFET 530 is connected to $V_{DD}$, while the drain of the MOSFET 530 is connected to the gate of the MOSFET 520 and the drains of the MOSFETs 532, 534, and 536. The sources of the MOSFETs 532 and 534 are connected to $V_{DD}$. The source of the MOSFET 536 is connected to the drain of the MOSFET 538, while the source of the MOSFET 538 is connected to the drain of the MOSFET 540.

The source of the MOSFET 540 is connected to a lower power supply, such as ground. In the following description, the term ground is used and a around symbol is shown in the FIGs. However, the present disclosure can also be used with a power supply such as $V_{SS}$, which may be a negative power supply, in place of ground.

The sense amp module 508 includes MOSFETs 550, 552, 554, 556, 558, 560, 562, 564, and 566. In addition, the sense amp module 508 includes inverters 570, 572, 574, 576, 578, and 580 and NAND gates 584 and 586. The source of the MOSFET 552 is connected to the node D, and the drain of the MOSFET 552 is connected to the drains of the MOSFETs 550, 556, and 554 at node DZB. The gates of the MOSFETs 560, 564, 540, and 530, as well as the input of the inverter 580, are also connected at the node DZB.

The source of the MOSFET 550 is connected to $V_{DD}$, while the gate of the MOSFET 550 is connected to the output of the inverter 574. The input of the inverter 574 is connected to the output of the inverter 572. The input of the inverter 572 receives a clock signal CK. The MOSFET 550 and the inverters 572 and 574 may collectively be referred to as a pull-up module 590. The pull-up module 590 may pull up the node DZB to a high value when the clock signal is low, and may be disabled after the clock signal goes high.

The first input of the NAND gate 584 receives the clock signal and the second input of the NAND gate 584 is connected to $V_{DD}$. With the second input forced high, the NAND gate 584 may operate similarly to an inverter. The output of the NAND gate 584 is received by the input of the inverter 570. The output of the inverter 570 is provided to the gates of the MOSFETs 566 and 562. The inverter 570 and the NAND gate 584 may be collectively referred to as a clock delay module 594. The clock delay module 594 may buffer and delay the clock signal.

The first input of the NAND gate 586 receives the clock signal CK and the second input of the NAND gate 586 is connected to node DZ. The node DZ is connected to the gates of the MOSFETs 554, 532, and 538 and the drains of the MOSFETs 560, 562, and 564. The NAND gate 586 is referred to as a clock gating module 598, which selectively passes the clock signal according to feedback received from the node DZ.

The output of the NAND gate 586 is received by the inputs of the inverters 576 and 578. The output of the inverter 576 is connected to the gate of the MOSFET 552 and is referred to as the evaluation (EVAL) node. Together, the MOSFET 552 and the inverter 576 are referred to as an isolation module 604. The isolation module 604 selectively connects the input D to the node DZB. In various implementations, the isolation module 604 may be replaced with other isolation devices, such as a pass gate.

The output of the inverter 578 is connected to the gate of the MOSFET 556. The output of the inverter 580 is connected to the gate of the MOSFET 558. The drain of the MOSFET 558 is connected to the source of the MOSFET 556 and the source of the MOSFET 558 is connected to ground. Together, the MOSFETs 554, 556, 568 and the inverters 578 and 580 are referred to as a dynamic node adjustment module 608.

The source of the MOSFET 564 is connected to the drain of the MOSFET 566, and the source of the MOSFET 566 is connected to ground. The sources of the MOSFETs 560 and 562 are connected to $V_{DD}$. Together, the MOSFETs 560, 562, 564, and 566 are referred to as a feedback module 612. The feedback module 612 provides feedback to the clock gating module 598, the MOSFET 554, and the injection control module 504 via the node DZ. If the node DZ goes low, the node DZB is prevented from going low, and vice versa. Specifically, when the node DZ goes low, the MOSFET 554 is turned on, connecting the node DZB to $V_{DD}$. Similarly, when the node DZB goes low, the MOSFET 560 is turned on, connecting the node DZ to $V_{DD}$.

As discussed below, the inverter 580 and the MOSFET 558 of the dynamic node adjustment module 608 provide positive feedback to the node DZB. When the node DZB falls below a threshold, the output of the inverter 580 goes high, turning on the MOSFET 558. The MOSFET 558 connects the node DZB to ground via the MOSFET 556 and therefore pulls the node DZB down.

The latch module 512 includes MOSFETs 620, 622, 624, 626, 628, 632, 634, 636, 638, 640, 642, and 644. The latch module 512 also includes inverters 650 and 652. The output of the inverter 570 of the clock delay module 594 is connected to the gates of the MOSFETs 626, 634, and 642, as well as to the input of the inverter 650. Node DZB of the sense amp module 508 is connected to the gates of the MOSFETs 620, 624, 640, and 644. The sources of the MOSFETs 620 and 622 are connected to $V_{DD}$, while the drains of the MOSFETs 620 and 622 are connected to the drain of the MOSFET 624 and output Q from the latch module 512. The source of the MOSFET 624 is connected to the drains of the MOSFETs 626 and 628. The sources of the MOSFETs 626 and 628 are connected to around.

The source of the MOSFET 632 is connected to $V_{DD}$ and the drain of the MOSFET 632 is connected to the source of the MOSFET 634. The source of the MOSFET 634 is connected to the drains of the MOSFETs 636, 640, and 642, as well as the input of the inverter 652. The output of the inverter 652 is connected to the gates of the MOSFETs 638, 632, 628, and 622. The source of the MOSFET 640 is connected to $V_{DD}$. The source of the MOSFET 642 is connected to the drain of the MOSFET 644 and the source of the MOSFET 644 is connected to ground. The latch module 512 operates based on the rising edge of the clock CK and retains the output Q when the evaluation stage is done. The latch module 512 maintains the output Q at the same level while the node DZB is precharged back to a high level by the pull-up module 590 during the precharge stage. The latch module 512 allows the output Q to be modified at the next rising edge of the clock CK.

Referring now to FIG. 4B, an example of operation is shown for a flip-flop similar to that of FIG. 4A. Control begins at 654, where control determines whether a rising edge of the clock is occurring. If so, control continues at 656; otherwise, control returns to 654. In other implementations, a falling edge of the clock may be used as a trigger instead of the rising edge of the clock.

At 656, control activates the injection enable signal to start charge injection. Control continues at 658, where control connects a charge sharing node D to the dynamic node DZB. Control continues at 660, where control determines whether the voltage of the dynamic node DZB has fallen below a threshold. If so, control transfers to 662; otherwise, control transfers to 664.

At 662, control latches the output Q at a high value. Control continues at 666, where control deactivates the injection enable signal to stop charge injection. Control continues at 668, where control determines whether the clock signal is falling. If so, control transfers to 670; otherwise, control remains in 668. At 670 control connects the dynamic node DZB to a power supply to reset the dynamic node DZB. In addition, control disconnects the charge sharing node D from the dynamic node DZB. Control then returns to 654.

At 664, control latches the output Q at a low value. Control continues at 672, where control disconnects the charge sharing node D from the dynamic node DZB. Control continues at 674, where control deactivates the injection enable signal to stop charge injection. Control then returns to 654.

Referring now to FIG. 5A, an example of combinational logic is shown. In various implementations. MOSFETs used in the combinational logic may be of the same type, whether N-channel or P-channel. In FIG. 4A, the node D receives charge injected from the power supply $V_{DD}$. Therefore, corresponding combinational logic created from N-channel MOSFETs may provide a path to ground. In other implementations, such as where charge injection is provided from the ground potential, P-channel MOSFETs may form combinational logic connected to the positive power supply.

In the example of FIG. 5A, 30 MOSFETs are show; there are 10 sets of MOSFETs, and within each set are three MOSFETs. The MOSFETs in each set are connected in series. In the first set, MOSFETs 680-1, 682-1, and 684-1 are connected in series, the drain of the MOSFET 680-1 is connected to the node D, and the source of the MOSFET 684-1 connected to ground. The gates of the MOSFETs 680-1, 682-1, and 684-1 each receive an input value.

When all three of the MOSFETs 680-1, 682-1, and 684-1 receive a high value at their gate, a low resistance path is formed between the node D and ground. MOSFETs 680-2, 682-2, and 684-2 are arranged similarly to the MOSFETs 680-1, 682-1, and 684-1. Each of the sets of MOSFETs may be similarly arranged, ending with MOSFETs 680-10, 682-10, and 684-10. A low-resistance path is formed between the node D and ground if all of the MOSFETs of any one or more of the sets of MOSFETs receives high input signals. In terms of digital logic, this may be equivalent to a ten-way OR of ten three-way ANDs.

In this disclosure, a low resistance path between the node D and around, created by the combinational logic, will result in a high output of Q. The present disclosure could instead operate in the reverse, where a low of value of Q would be output when a low resistance path is present Additionally, as described above, P-channel MOSFETs could be used to create a low resistance path to $V_{DD}$. In such implementations, the circuitry of FIG. 4A may be modified, such as by creating an inverted version of FIG. 4A. Additionally or alternatively, one or more inverting structures, such as an inverter, may convert a low resistance path to around into a low resistance path to $V_{DD}$ or vice versa.

Referring back to FIG. 5B, a simplified combinational logic circuit is shown for purposes of the illustrations of FIGS. 6-7. An inverter 690 receives an input and provides an inverted version of the input to the gate of a MOSFET 692. The source of the MOSFET 692 is connected to around, while the drain of the MOSFET is connected to the node D. Therefore, when the input signal is high, the MOSFET 692 is in a non-conducting (high resistance) state. When the input signal is low, the MOSFET 692 is placed in a conducting (low resistance) state.

Figure 6A:
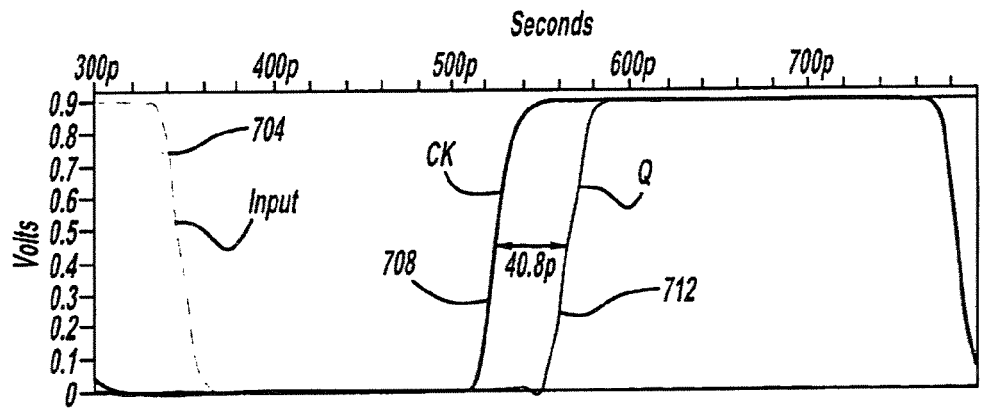
FIG. 6A-6C are examples of signal traces based on an implementation of the circuitry of FIG. 4A.
Figure 6B:
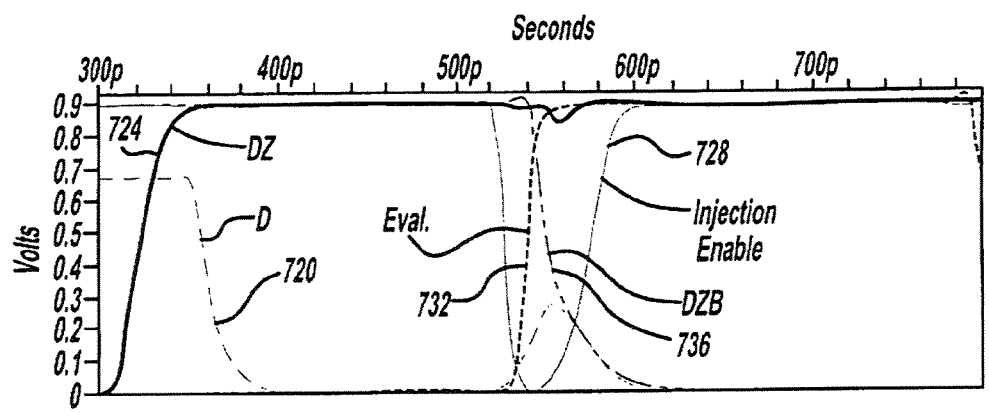
Figure 6C:
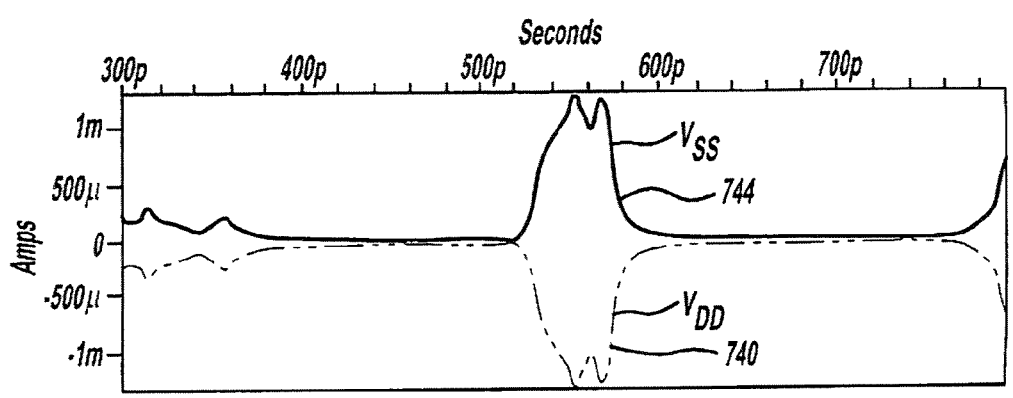

Referring now to FIG. 6A-6C, example traces are shown of an implementation of the circuitry of FIG. 4A. In FIG. 6A, a plot of voltage versus time is shown. The time scale of FIGS. 6-7 is from approximately 300 picoseconds to 700 picoseconds and is shown for illustration only. There is no significance to the time of zero picoseconds; instead, only the relative times are relevant. Between approximately 340 and 360 picoseconds, a trace 704 of the input signal (for conciseness, the trace 704 of the input signal will be referred to as the input signal 704) shows the input signal 704 transitioning from high (approximately 0.9 volts in the depicted implementation) to low (approximately 0 volts in this implementation).

At a later time, shown here between approximately 520 and 540 picoseconds, a trace 708 of the clock signal CK rises from low to high. The input signal 704 is inverted, as shown in FIG. 5B, and a rising edge of the clock signal 708 is used to latch the logic value. The output Q 712 therefore transitions to high to match an inverted version of the input in response to the clock rising. An approximate delay between midpoints of the rise of the clock signal 708 and the rise of the output Q 712 is 40.8 picoseconds. At approximately 780 picoseconds, the clock signal 708 falls. The output Q 712, however, stays high because the output Q 712 was latched based on a rising edge of the clock signal 708.

FIG. 6B depicts additional voltage traces during the same time window as FIG. 6A. The fall in the input signal 704 causes a corresponding fall in a trace 720 of the node D. This is because the input signal 704 has turned on the MOSFET 692, connecting the node D 720 to ground.

A trace 724 of the node DZ is shown rising to a high value. Referring to FIG. 4A, when the clock signal 708 is low, the output of the inverter 570 is also low, which drives the gate of the MOSFET 562 low, thereby connecting the node DZ to $V_{DD}$. The clock signal 708 went low prior to the tune window shown in FIG. 6B.

Based on the rise of the clock signal 708, a trace 728 of the injection enable signal falls (beginning at approximately 520 picoseconds). This is caused by the injection control module 504 responding to the rising, clock signal. The MOSFETs 538 and 540 are already conducting because their gates are high, so when the clock signal 708 rises and turns on the MOSFET 536, the injection enable signal 728 is connected to ground.

As a result of the injection enable signal 728 going low, the MOSFET 520 of the charge injection circuit 500 injects charge onto the node D. For this reason, the node D 720 begins to increase at approximately 520 picoseconds. However, the low resistance path to ground (because the MOSFET 692 is on for the current input signal) causes the injected charge to be dissipated, and so the node D 720 falls back to a low value starting at approximately 550 picoseconds.

After a delay resulting from the NAND gate 586 of the clock gating module 598 and the inverter 576 of the isolation module 604, a trace 732 of the EVAL signal follows the clock signal 708 from low to high. Because the EVAL signal 732 is high, the MOSFET 552 connects the node DZB to the node D, which pulls a trace 736 of the node DZB low. The node DZB 736 going low causes the injection control module 504 to de-assert the injection enable signal 728.

The MOSFET 558 provides positive feedback. Once the node DZB falls far enough, the inverter 580 will output a high signal to the MOSFET 558. This turns the MOSFET 558 on, connecting the node DZB to ground via the MOSFET 556. The latch module 512 buffers and drives the logic of DZB during the evaluation period. The falling value of the node DZB 736 is translated to the output Q 712 as a rising edge and is latched by the latch module 512. Later (at the right edge of FIG. 6A), the clock signal 708 falls, and the pull-up module 590 will cause the node DZB 736 to rise accordingly (not shown). Meanwhile, the latch module 512 keeps the output Q from being corrupted by this pre-charge process.

Referring to FIG. 6C, current flowing in the positive power supply $V_{DD}$ and current flowing in the negative power supply, $V_{SS}$ or ground, is shown over the same e period as FIGS. 6A and 6B. As seen, the greatest power consumption occurs following the rising edge of the clock signal 708. The trace of $V_{DD}$ is labeled 740 and the trace of $V_{SS}$ is labeled 744.

Figure 7A:
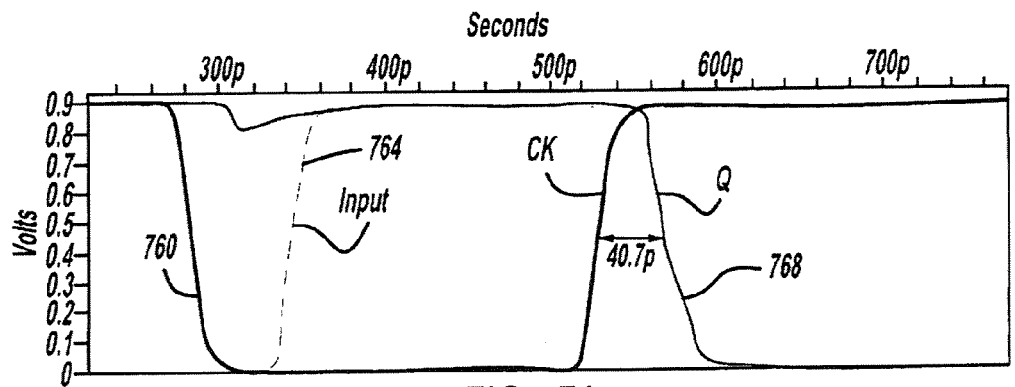
FIG. 7A-7C are examples of signal traces similar to those of FIGS. 6A-6C for a different input signal.
Figure 7B:
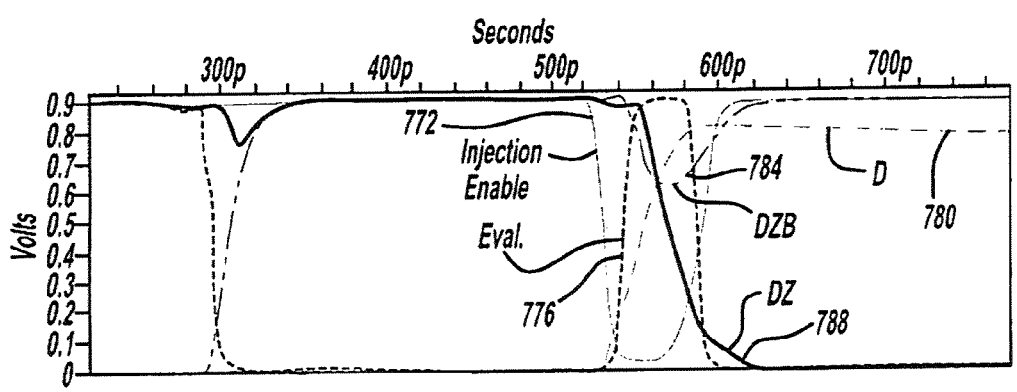
Figure 7C:
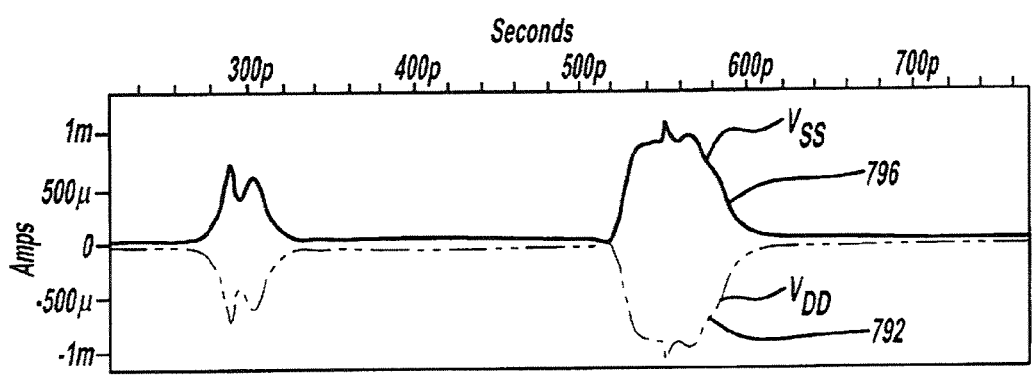

Referring now to FIG. 7A-7C, traces similar to those of FIGS. 6A-6C are shown for a situation in which the input signal is high. Although the traces may be taken from the same nodes as in FIGS. 6A-6C, new reference numerals will be used to avoid confusion. A trace 760 of clock signal CK falls beginning at approximately 280 picoseconds. A trace 764 of the input signal, which may be asynchronous to the clock, begins to rise at approximately 340 picoseconds.

The rising edge of the clock signal 760 begins at approximately 520 picoseconds. The clock signal 760 causes the inverse of the input signal 764 to be latched as output Q, shown in trace 768. A delay between the midpoints of the rising edge of the clock signal 760 and the falling edge of the output Q 768 is shown as approximately 40.7 picoseconds in this implementation. In this particular implementation, the delay from clock to output when Q is falling (FIG. 7A) or when Q is rising (FIG. 6A) differs by less than one percent. The small size of this difference may be beneficial, as the maximum clock speed may be determined by the longer of the two numbers. Therefore, if one delay were significantly longer, the longer delay may necessitate a lower maximum clock speed.

Referring now to FIG. 7B, a trace 772 of the injection enable signal falls beginning at approximately 520 picoseconds in response to the rising clock signal 760. When the injection enable signal 772 goes low, thereby initiating charge injection from the charge injection circuit 500, a trace 780 of the node D rises as there is no low resistance path to ground.

After a delay, a trace 776 of the EVAL signal follows the clock signal 760 from low to high. The high value of the EVAL signal 776 connects the node DZB to the node D. A trace 784 of the node DZB may therefore initially fall because the node D 780 began with a low voltage. However, the charge injection onto the node D 780 raises the node D 780 and thereby raises the node DZB 784.

Note that in FIG. 6B, the node D 720 rose slightly (peaking approximately 560 picoseconds). However, in FIG. 7B, the node D 780 rises above a first threshold, and thereby keeps the node DZB 784 from falling below a second threshold. For example, in FIG. 7B, the node DZB 784 dips to only approximately 0.65 Volts. Meanwhile, the node D 780 increases from 0 Volts to approximately 0.8 Volts.

If the node DZB 784 falls below the second threshold, and therefore registers as a low signal, the inverter 580 (see FIG. 4A) then outputs a high signal, turning on the MOSFET 558 and pulling down the node DZB 784 via the MOSFET 556. Note that until the node DZ falls, the input to the inverter 578 is low, the output of the inverter 578 is high, and the MOSFET 556 is therefore turned on.

The second threshold may therefore be based on the input voltage at which the inverter 580 outputs a voltage high enough to turn on the MOSFET 558. For example only, the second threshold may be 0.5 Volts. In order to prevent the node DZB 784 from falling below the second threshold, the node D 780 should increase above the first threshold prior to the node DZB 784 falling below the second threshold. This consideration may determine the sizing of the MOSFET 520 of the charge injection module 500. In various implementations, the first threshold may be approximately equal to the second threshold. The first threshold may be 0.5 Volts. The first and second thresholds may be set based on a voltage halfway between $V_{DD}$ and $V_{SS}$ or between $V_{DD}$ and ground.

When the delayed clock signal from the clock delay module 594 rises, the MOSFET 566 is turned on. The node DZB 784 has remained high, so the MOSFET 564 remains on. The node DZ 788 is therefore connected to ground via the MOSFETs 564 and 566 and begins to fall. As the node DZ 788 falls, the EVAL signal 776 is turned off via the clock gating module 598. By disconnecting the node D from the node DZB, even if a low resistance path is suddenly created by the combinational logic the charge on the node DZB will not be dissipated. The clock gating module 598 therefore decreases the hold time the amount of time inputs to the flip-flop must be held steady. In addition, the injection enable signal 772 is de-asserted. In fact, the injection control module 504 de-asserts the injection enable signal 772 when either the node DZB 784 or the ode DZ 788 falls. See FIG. 6B for an example where the injection enable signal 728 rises (i.e., is de-asserted) in response to the node DZB 736 falling.

The latch module 512 buffers and drives the logic of the node DZB during the evaluation phase. The latch module 512 stores the opposite of the node DZB as output Q 768. Once the clock signal 760 falls (not shown), the node DZ 788 will return to a high value (also not shown) while the latch module 512 keeps the output Q from being corrupted by the precharging process. The node DZ 788 is raised to a high value by the MOSFET 562; once the delayed clock signal from the clock delay module 594 falls, the MOSFET 562 connects the node DZ 788 to $V_{DD}$.

Referring now to FIG. 7C, a trace 792 of $V_{DD}$ and a trace 796 of $V_{SS}$ or ground are shown during the same time frame as FIGS. 7A and 7B.

Figure 8A:
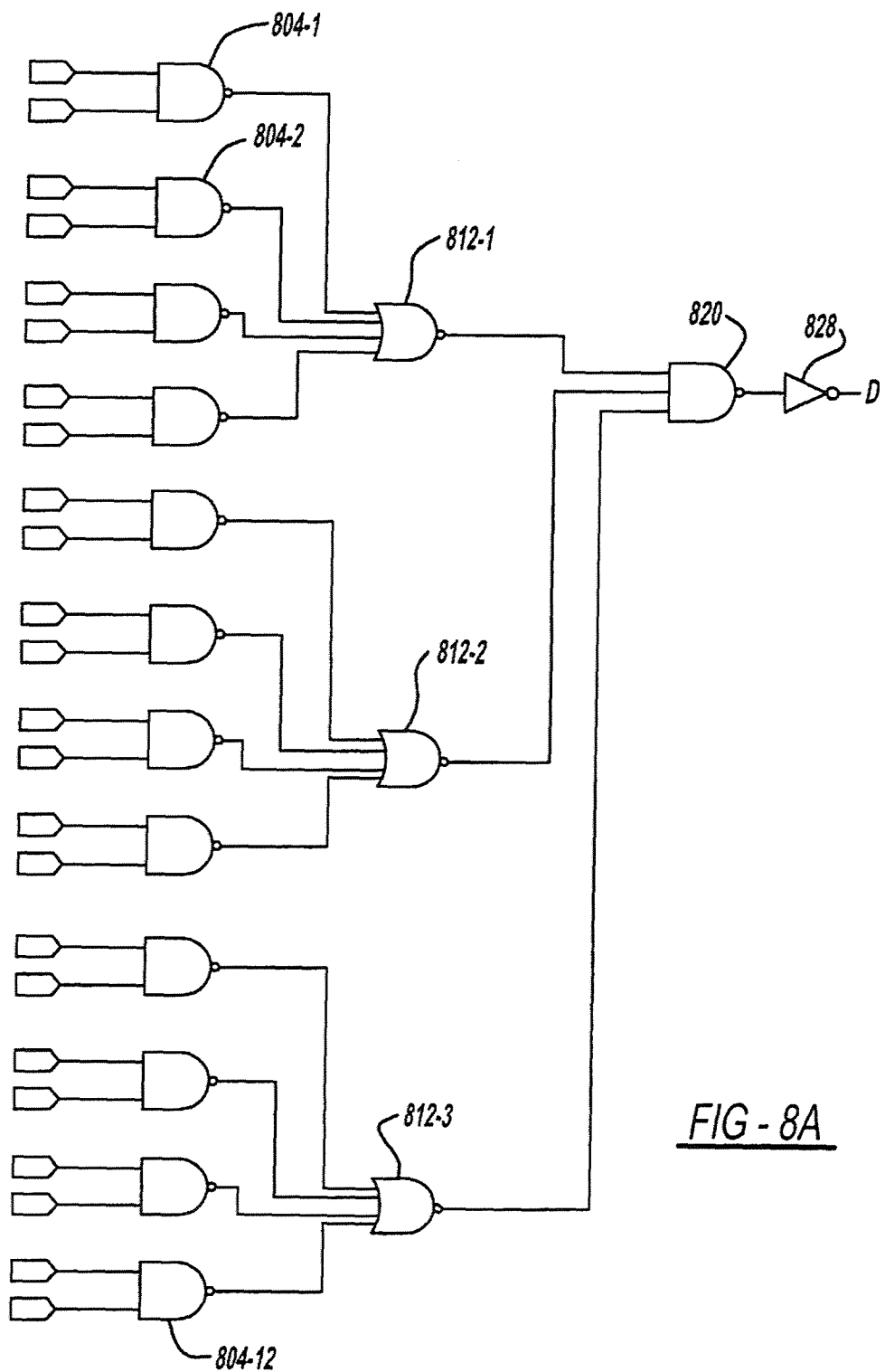
FIG. 8A is a circuit diagram of a static combinational logic.
Figure 8B:
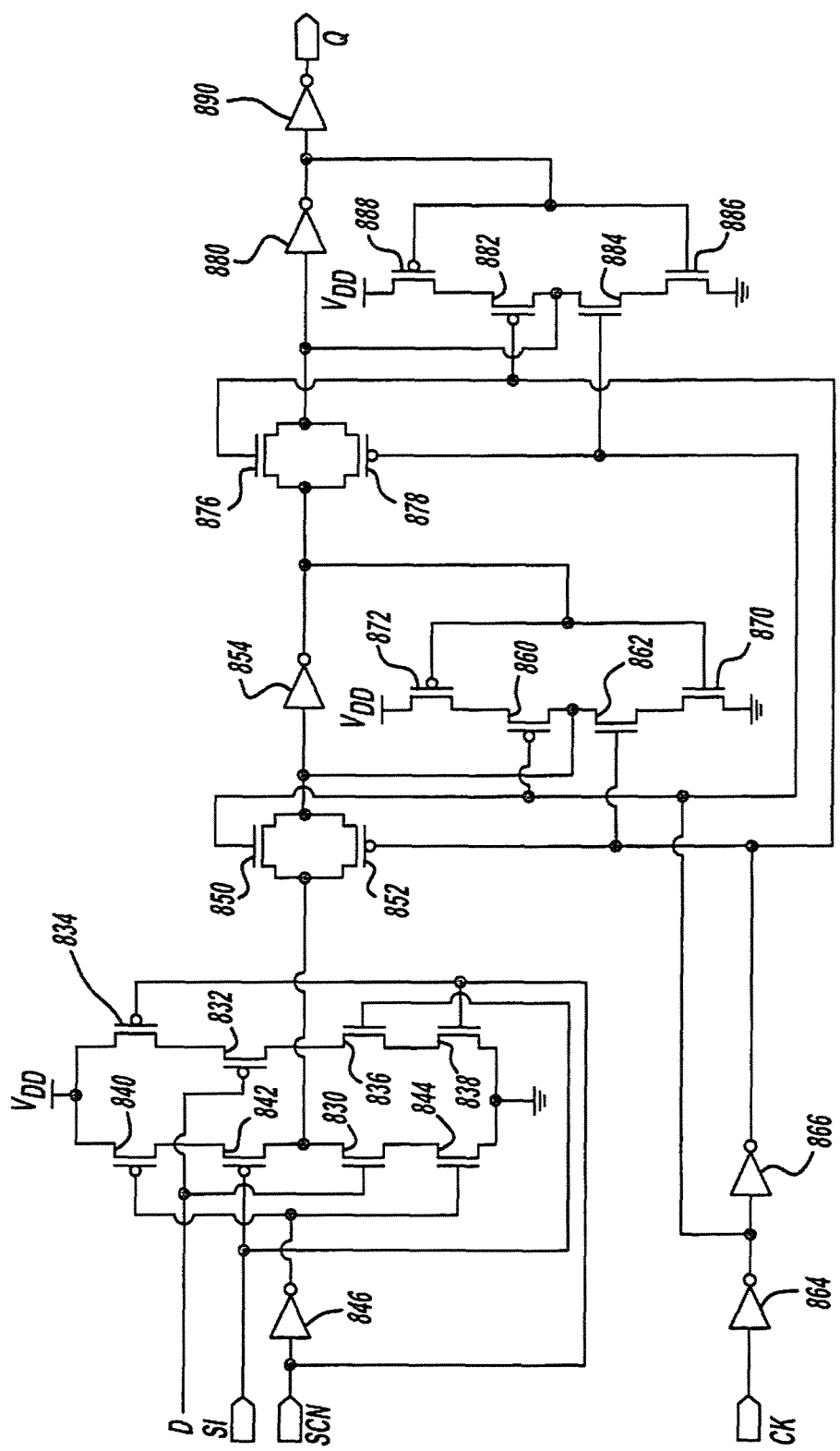
FIG. 8B is a circuit diagram of a static flip-flop.
Figure 9A:
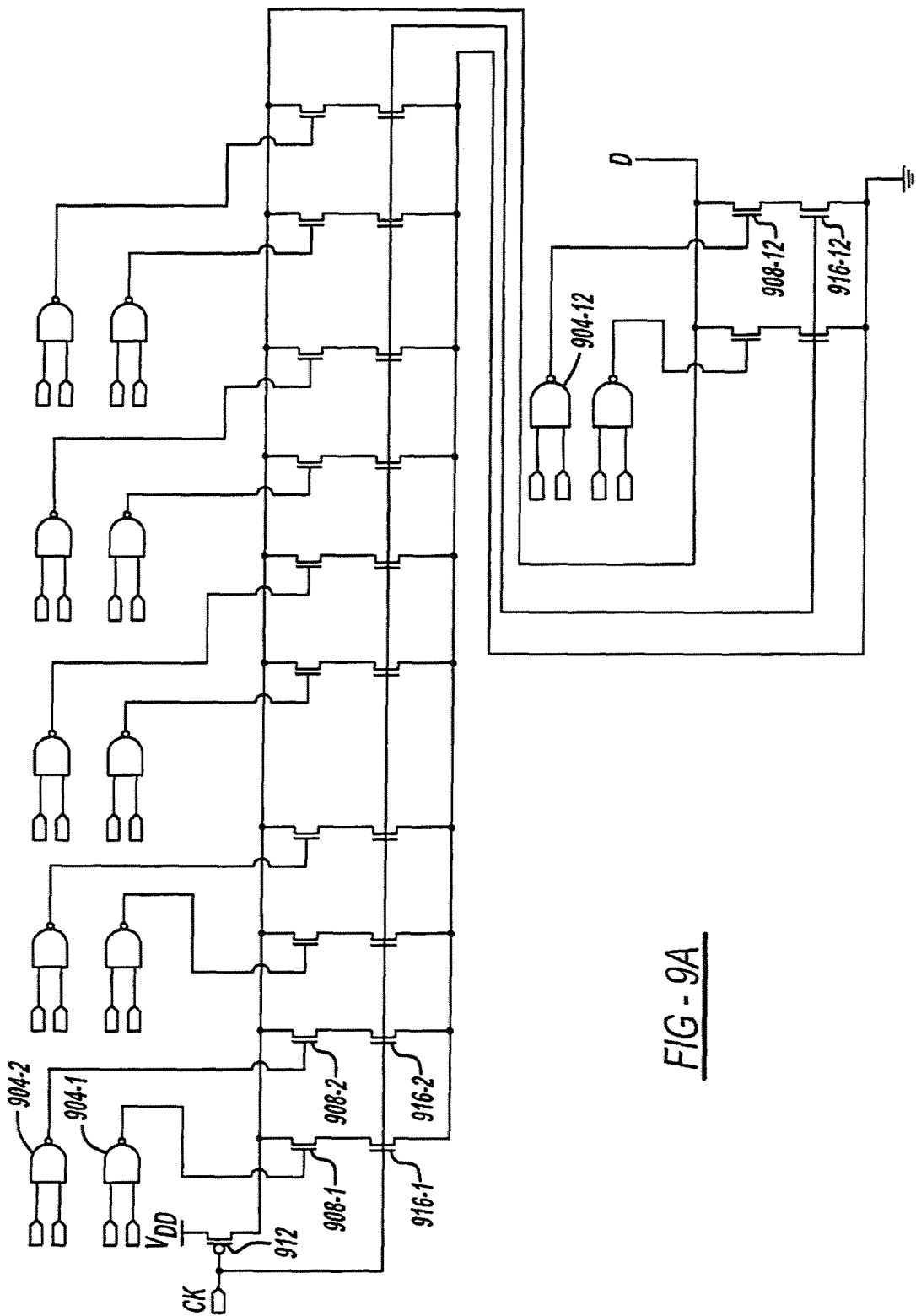
FIG. 9A is a circuit diagram of a logic for a dynamic flip-flop.
Figure 9B:
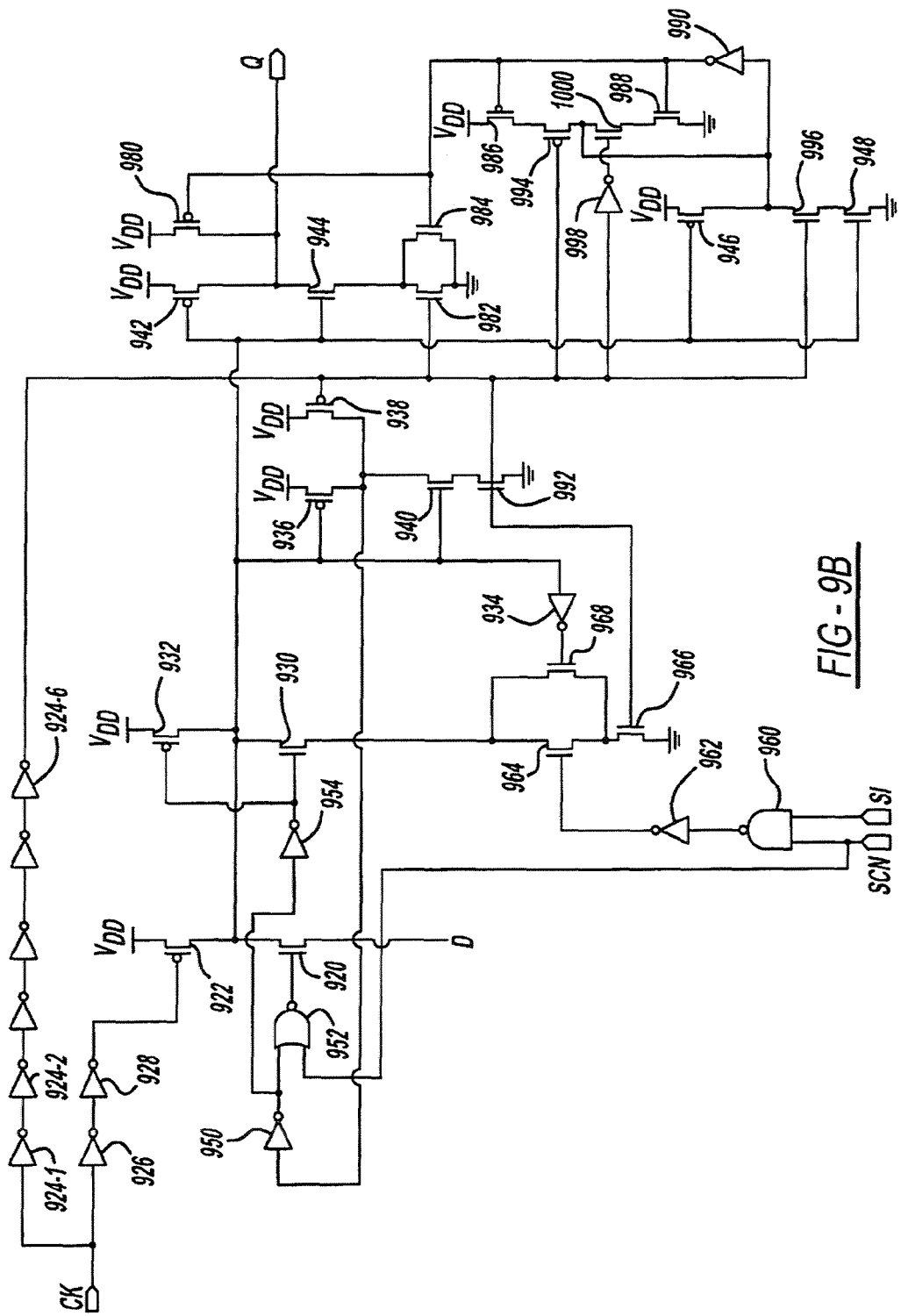
FIG. 9B is a circuit diagram of a dynamic flip-flop.
Figure 10A:
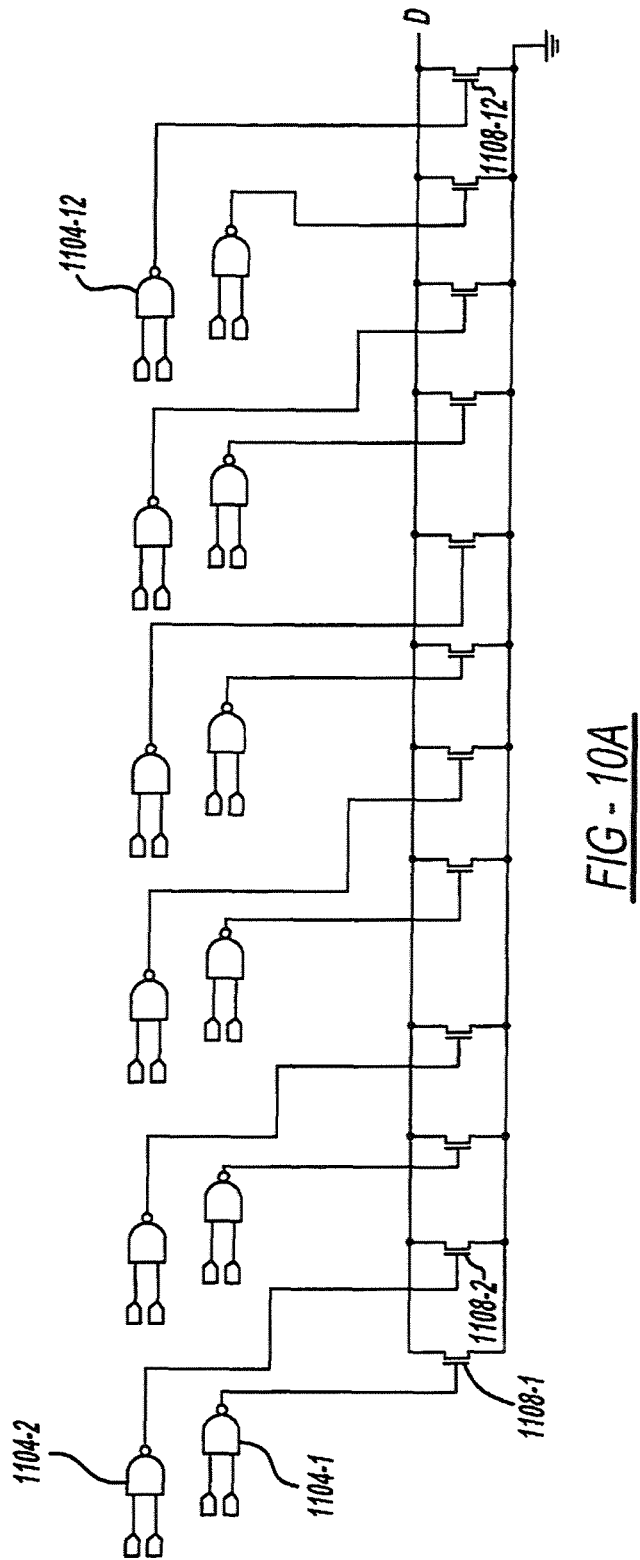
FIG. 10A is a circuit diagram of an implementation of combinational logic for use with a charge injection flip-flop.
Figure 10B:
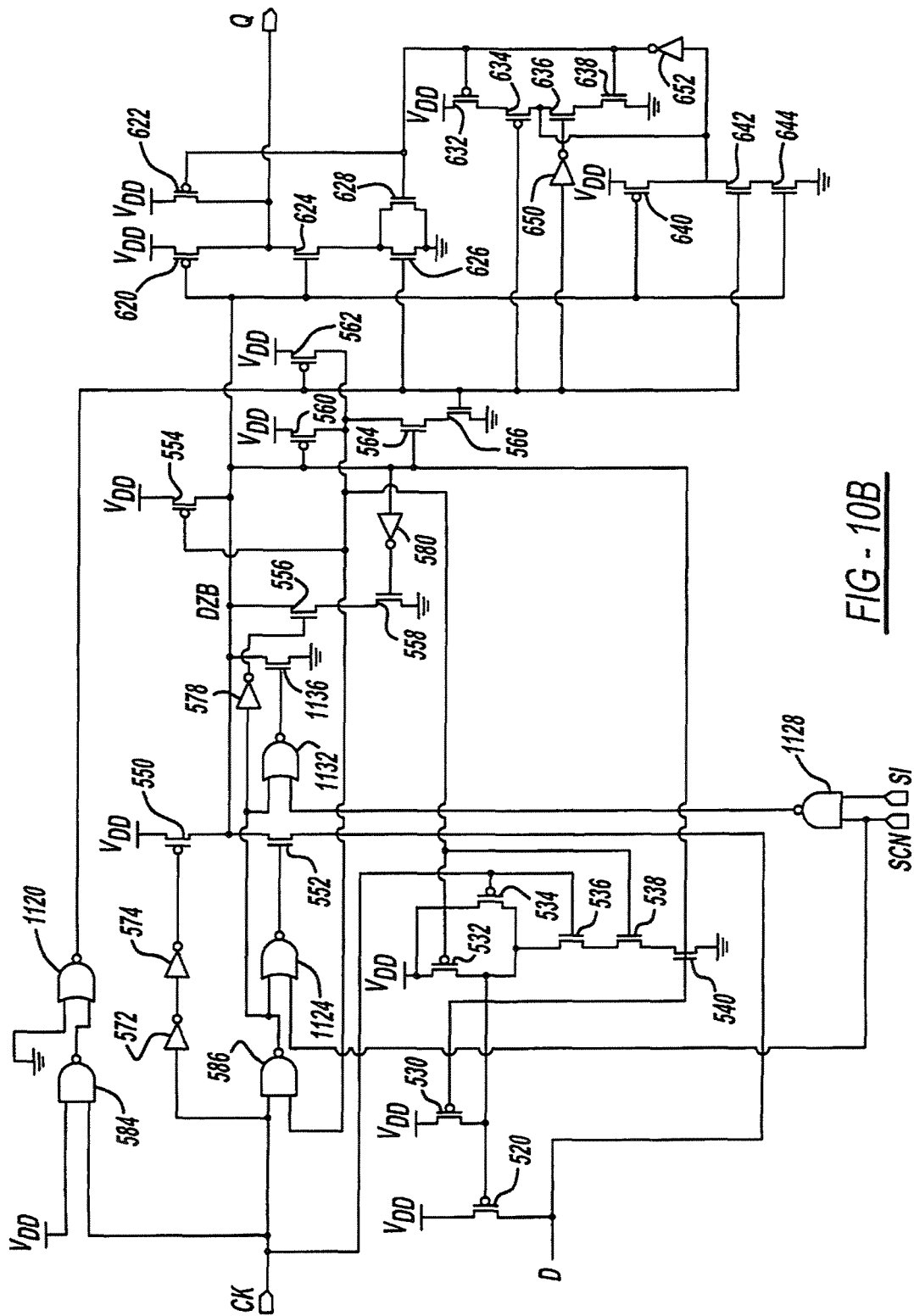
FIG. 10B is a circuit diagram of an implementation of a charge injection flip-flop.
Figure 11:
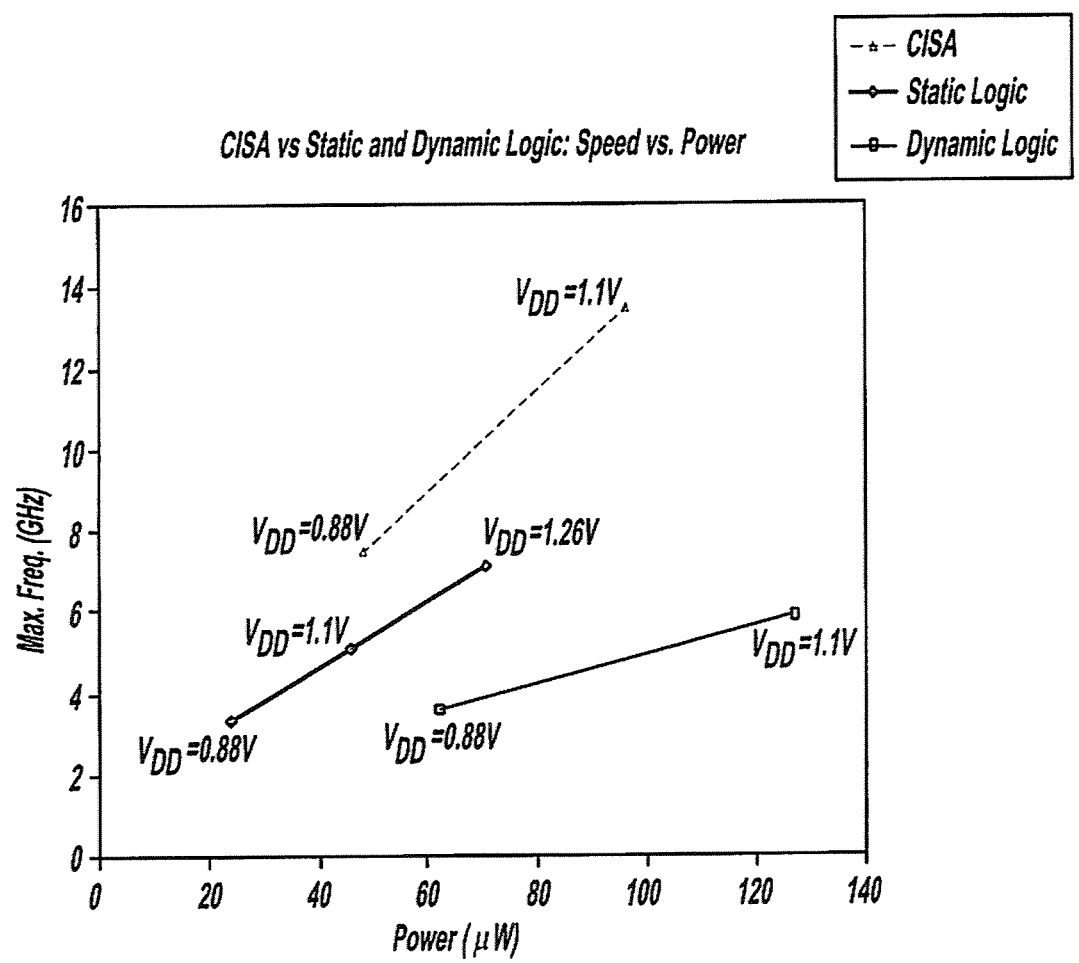
FIG. 11 is a graphical comparison of performance results resulting from simulating the circuits shown in FIGS. 8-10.

FIGS. 8A-9B are presented to show analogous static and dynamic logic for comparison with charge-injection logic of FIGS. 10A-10B. While FIGS. 8A-9B result in the same logical output in response to the input signals as in FIGS. 10A-10B, the circuitry and operating principles of the flip-flops are different, and the arrangement of combinational logic at the input of the flip-flops is also different.

Referring now to FIG. 8A, an example of static combinational logic is presented. The logic includes 12 NAND gates 804-1, 804-2, ..., and 804-12 (collectively. NAND gates 804), which each have two inputs. Three NOR gates 812-1, 812-2, and 812-3 (collectively. NOR gates 812) each receive the outputs of four of the NAND gates 804. The outputs of the NOR gates 812 are received by a NAND gate 820. The output of the NAND gate 820 is received by the input of inverter 828. The output of the inverter 828 is node D.

Referring now to FIG. 8B, a static flip-flop is shown. Logic value D is connected to the gates of MOSFETs 830 and 832. From $V_{DD}$ to ground, four MOSFETs 834, 832, 836, and 838 are arranged in series. In addition, a second series of MOSFETs 840, 842, 830, and 844 is connected from $V_{DD}$ to ground.

Gates of the MOSFETs 842 and 836 receive a signal SI. Gates of the MOSFETs 834 and 838 receive a signal SCN. The gates of the MOSFETs 840 and 844 receive an inverse of the signal SCN from an inverter 846. The signals SI and SCN can be used to scan in specified data to the flip-flop, such as for testing purposes. The signal SCN enables or disables scan mode, and when scan mode is enabled, the data stored in the flip-flop is taken from the signal SI. The signal SI may be connected to a previous flip-flop, so that arbitrary data, such as test patterns, can be serially shifted (scanned) into the flip-flops.

MOSFETs 850 and 852 form a pass gate, which receives a signal from the node between the MOSFETs 830 and 842. An output of the pass gate formed by the MOSFETs 850 and 852 is provided to an inverter 854 as well as to a node between MOSFETs 860 and 862.

A clock signal CK is inverted by an inverter 864 and inverted once again by an inverter 866. As a result, an output of the inverter 866 has the same polarity, although with some delay, as the clock signal CK. The pass gate formed by the MOSFETs 850 and 852 is controlled by the clock signal CK, with a high value of the clock signal CK turning off the pass gate.

The MOSFET 862 is connected to ground via a MOSFET 870, while the MOSFET 860 is connected to $V_{DD}$ via a MOSFET 872. The gate of the MOSFET 860 receives the inverted clock signal CK, while the gate of the MOSFET 862 receives the twice-inverted clock signal CK. An output of the inverter 854 is provided to MOSFETs 876 and 878, which form another pass gate. In addition, the output of the inverter 854 drives the gates of the MOSFETs 870 and 872. The MOSFETs 860, 862, 870 and 872 form a tri-state inverter that is tri-stated in response to the clock signal CK.

The pass gate formed by the MOSFETs 876 and 878 is turned on when the clock signal CK is high. An output of the pass gate formed by the MOSFETs 876 and 878 is provided to an inverter 880 as well as to a node between MOSFETs 882 and 884. The MOSFET 884 is connected to ground via a MOSFET 886, while the MOSFET 882 is connected to $V_{DD}$ via a MOSFET 888. The gate of the MOSFET 882 receives the twice-inverted clock signal, while the gate of the MOSFET 884 receives the inverted clock signal. The output of the inverter 880 is received by an inverter 890 and the gates of the MOSFETs 886 and 888. The output of the inverter is also the output Q of the flip-flop.

Referring, now to FIG. 9A, an implementation of dynamic logic is shown. The combinational logic shown may be logically equivalent to that of FIG. 8A. Twelve NAND gates 904-1, 904-2, ..., and 904-12 (collectively. NAND gates 904) each receive two inputs and provide an output to corresponding MOSFETs 908-1, 908-2, ..., and 908-12 (collectively. MOSFETs 908). The MOSFETs 908 are all connected to $V_{DD}$ via a common MOSFET 912, which is controlled by a clock signal CK. In other words, the source of the MOSFET 912 is connected to the drain of each of the MOSFETs 908. The MOSFET 912 loosely corresponds to the faucet 444 of FIG. 3B to pre-charge the node D.

Each of the MOSFETs 908 is connected to ground by respective MOSFETs 916-1, 916-2, ..., and 916-12 (collectively. MOSFETs 916). The MOSFETs 916 are also controlled by the clock signal CK and loosely correspond to the evaluation e 448 of FIG. 3B. The MOSFETs 908 loosely correspond to the logic valves of FIG. 3B.

Referring now to FIG. 9B, in a dynamic logic flip-flop, the node D is connected to the source of a MOSFET 920. The MOSFET 920 is connected to $V_{DD}$ via a MOSFET 922. The clock signal CK is inverted by a first series of inverters 924-1, 924-2, ..., and 924-6, as well as a second series of inverters 926 and 928. The output of the inverter 928 therefore follows the same polarity as the clock signal CK, and is connected to the gate of the MOSFET 922. The drains of the MOSFETs 920 and 922 are connected to the drains of MOSFETs 930 and 932, the input of an inverter 934, and the gates of MOSFETs 936, 938, 940, 942, 944, 946, and 948.

The sources of the MOSFETs 936 and 938 are connected to $V_{DD}$ and the drains of the MOSFETs 936 and 938 are connected to the drain of the MOSFET 940 as well as the input of an inverter 950. The output of the inverter 950 is provided to a first input of a NOR gate 952 and the input of an inverter 954. The output of the inverter 954 is connected to the gates of the MOSFETs 930 and 932. The source of the MOSFET 932 is connected to $V_{DD}$.

The second input of the NOR gate 952 receives the signal SCN. A NAND gate 960 has two inputs, which receive the signal SCN and the signal SI, respectively. An output of the NAND gate 960 is provided to the input of an inverter 962, and the output of the inverter 962 is connected to the gate of a MOSFET 964. The MOSFET 964 is connected to ground via a MOSFET 966. The MOSFET 964 is connected in parallel with a MOSFET 968. The output of the inverter 934 is connected to the gate of the MOSFET 968. The drains of the MOSFETs 964 and 968 are connected to the source of the MOSFET 930.

The MOSFET 942 is connected in parallel with a MOSFET 980, and the drains of the MOSFETs 942 and 980 are connected to the drain of the MOSFET 944 and to the output Q. The sources of the MOSFETs 942 and 980 are connected to $V_{DD}$. The MOSFET 944 is connected to ground via MOSFETs 982 and 984, which are connected in parallel. The gates of the MOSFETs 980 and 984 are connected to gates of MOSFETs 986 and 988 as well as to the output of an inverter 990.

The output of the inverter 924-6 is connected to the gates of the MOSFETs 938, 982, 966, 992, 994, and 996, as well as to the input of an inverter 998. The output of the inverter 998 is connected to the gate of a MOSFET 1000. The MOSFETs 986, 994, 1000, and 988 are connected in series from $V_{DD}$ to ground. The MOSFETs 946, 996, and 948 are connected in series from $V_{DD}$ to ground. The MOSFET 992 is connected in series between the MOSFET 940 and around. The drains of the MOSFETs 946 and 996 are connected to the drains of the MOSFETs 994 and 1000 as well as to the input of the inverter 990.

Referring now to FIG. 10A, an implementation of combinational logic for use with a charge injection flip-flop is shown. The combinational logic may be logically equivalent to that shown in FIGS. 8A and 9A. Twelve NAND gates 1104-1, 1104-2, ..., and 1104-12 (collectively. NAND gates 1104) each receive two inputs and provide an output to corresponding MOSFETs 1108-1, 1108-2, ..., and 1108-12 (collectively, MOSFETs 1108). Sources of the MOSFETs 1108 are connected to ground and drains of the MOSFETs 1108 are connected to a common node D. Note that in comparison with FIG. 9A, clocked MOSFETs (such as the MOSFETs 916 of FIG. 9A), also known as footer devices, are not necessary.

Referring now to FIG. 10B, an implementation of a charge injection flip-flop is presented. The implementation shown in FIG. 10B may be similar to that of FIG. 4A, and for simplicity, the same reference numerals will be used for similar components. A NOR gate 1120 is used in place of the inverter 570 of FIG. 4A. The NOR gate of 1120 has one put tied to ground and therefore operates similarly to an inverter.

A NOR gate 1124 is used in place of the inverter 576 of FIG. 4A. A second input of the NOR gate 1124 receives a signal SCN. A NAND gate 1128 receives the SCN signal and an SI signal as inputs and has an output connected to a NOR gate 1132. A second input of the NOR gate 1132 receives the output of the NAND gate 586. An output of the NOR gate 1132 drives the gate of a MOSFET 1136, which is connected between the node DZB and ground.

Referring now to FIG. 11, results from simulations of the circuits of FIGS. 8-10 are presented graphically for comparison. The charge-injection flip-flop of FIGS. 10A-10B, also referred to as a charge-injection sense amp (CISA), is shown with a dashed line. The static logic of FIGS. 8A-8B is shown with a thick, solid line, and the dynamic logic of FIGS. 9A-9B is shown with a thin, solid line. The y axis represents maximum operating frequency in gigahertz, z, while the x axis represents power consumption in micro watts at the specified maximum operating frequency.

All other things being equal, greater maximum frequency and lower power consumption are better. The circuits were simulated at different power supply voltages: 0.88 volts and 1.1 volts for all three, and additionally 1.26 volts for static logic. As can be seen in FIG. 11, for the circuits presented above and using the semiconductor process being simulated, the power consumption of the dynamic logic is much greater than that of static logic for comparable power supply voltages. The dynamic logic does allow for an increase in maximum frequency at comparable power supply voltages.

However, when the power supply of the static logic is increased to 1.26 volts, the power consumption is only somewhat greater than the power consumption of dynamic logic at the lowest operating voltage, while the maximum frequency is nearly double that of dynamic logic.

The CISA logic has a power consumption less than that of dynamic logic but more than that of static logic. However, at least for these examples, the maximum frequency possible using CISA logic is significantly higher than for static logic and dynamic logic. In addition to the speed and power consumption advantages over dynamic logic. CISA logic may also require less area. For example, the footer devices (such as the MOSFETs 916 shown in FIG. 9A) may not be necessary when using CISA logic. CISA logic may use N-channel MOSFETs, such as is shown in FIG. 10A. However. P-channel MOSFETs may alternately be used. The decision between N-channel and P-channel MOSFETs may be made based on such considerations as area and speed. For example, in certain process technologies. P-channel devices may require a separate well structure and therefore require more area.

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A flip-flop circuit comprising:
   a charge injection module configured to, in response to a clock signal, selectively provide electrical charge from a power supply to a first node;
   a sense amp module configured to adjust a voltage of a second node in response to detecting a voltage of the first node crossing a threshold while the charge injection module is providing the electrical charge to the first node; and
   a latch module configured to
      in response to the clock signal, store a value based on a voltage of the second node; and
      provide the value as an output of the flip-flop circuit,
   wherein the latch module is configured to store the value corresponding to the voltage of the second node in response to a predetermined edge of a delayed version of the clock signal, and
   wherein the predetermined edge is one of a rising edge and a falling edge.

2. The flip-flop circuit of claim 1, wherein the sense amp module comprises:
   a clock gating module configured to selectively generate a gated clock signal in response to the clock signal and a feedback signal; and
   an isolation module configured to selectively connect the second node to the first node in response to the gated clock signal.

3. The flip-flop circuit of claim 1, wherein the sense amp module comprises a second node adjustment module configured to connect the second node to a second power supply in response to the voltage of the second node decreasing below the threshold.

4. The flip-flop circuit of claim 1, wherein:
   the sense amp module comprises a feedback module configured to selectively generate a feedback signal,
   the charge injection module is configured to stop providing the electrical charge to the first node when either the feedback signal is generated or the voltage of the second node falls below the threshold, and
   the feedback module is configured to suspend generation of the feedback signal when the voltage of the second node falls below the threshold.

5. A circuit comprising:
   the flip-flop circuit of claim 1; and
   combinational logic that selectively creates a low-resistance path between the first node and a second power supply in response to at least one input signal, wherein a voltage of the second power supply is less than a voltage of the power supply.

6. A flip-flop circuit comprising:
   a charge injection module configured to, in response to a clock signal, selectively provide electrical charge from a power supply to a first node;
   a sense amp module configured to adjust a voltage of a second node in response to detecting a voltage of the first node crossing a threshold while the charge injection module is providing the electrical charge to the first node; and
   a latch module configured to
      in response to the clock signal, store a value based on a voltage of the second node; and
      provide the value as an output of the flip-flop circuit,
   wherein the sense amp module comprises a pull-up module configured to generate a delayed clock signal and selectively connect the second node to the power supply in response to the delayed clock signal.

7. A flip-flop circuit comprising:
   a charge injection module configured to, in response to a clock signal, selectively provide electrical charge from a power supply to a first node;
   a sense amp module configured to adjust a voltage of a second node in response to detecting a voltage of the first node crossing a threshold while the charge injection module is providing the electrical charge to the first node;
   a latch module configured to
      in response to the clock signal, store a value based on a voltage of the second node, and
      provide the value as an output of the flip-flop circuit; and
   an injection control module configured to generate an injection enable signal in response to the clock signal,
   wherein the charge injection module is configured to, in response to generation of the injection enable signal, provide the electrical charge to the first node.

8. The flip-flop circuit of claim 7, wherein the injection control module is configured to stop generating the injection enable signal in response to the second node reaching a predetermined state.

9. The flip-flop circuit of claim 7, wherein the sense amp module comprises:
   a feedback module configured to generate a feedback signal,
   wherein the injection control module is configured to stop generating the injection enable signal in response to generation of the feedback signal.

10. A circuit comprising:
    a flip-flop circuit comprising:
       (i) an injection control module configured to generate an injection enable signal in response to a clock signal;
       (ii) a charge injection module configured to selectively provide electrical charge from a first power supply to a first node in response to the injection enable signal;
       (iii) a sense amp module comprising:
          a clock delay module configured to generate a delayed clock signal in response to the clock signal;
          a feedback module configured to generate a feedback signal in response to the delayed clock signal and a voltage of a second node;
          a clock gating module configured to selectively generate a gated clock signal in response to the clock signal and the feedback signal;

an isolation module configured to selectively connect the second node to the first node in response to the gated clock signal; and a second node adjustment module configured to connect the second node to a second power supply in response to the voltage of the second node decreasing below a threshold; and (iv) a latch module configured to store a value based on the voltage of the second node in response to a predetermined edge of the clock signal, and provide the value as an output of the flip-flop circuit, wherein the predetermined edge is one of a rising edge and a falling edge; and combinational logic configured to selectively create a low-resistance path between the first node and the second power supply in response to at least one input signal, wherein the second power supply has a lower voltage than the first power supply.

11. A method of operating a flip-flop circuit, the method comprising:

in response to a clock signal, selectively providing electrical charge from a power supply to a first node;

adjusting a voltage of a second node in response to detecting a voltage of the first node crossing a threshold while the electrical charge is being provided to the first node;

in response to the clock signal, storing a value based on a voltage of the second node;

providing the value as an output of the flip-flop circuit; and storing the value corresponding to the voltage of the second node in response to a predetermined edge of a delayed version of the clock signal, wherein the predetermined edge is one of a rising edge and a falling edge.

12. The method of claim 11, further comprising:

selectively generating a gated clock signal in response to the clock signal and a feedback signal; and selectively connecting the second node to the first node in response to the gated clock signal.

13. The method of claim 11, further comprising connecting the second node to a second power supply in response to the voltage of the second node decreasing below the threshold.

14. The method of claim 11, further comprising:

selectively generating a feedback signal;

stopping providing the electrical charge to the first node when either the feedback signal is generated or the voltage of the second node falls below the threshold; and suspending generation of the feedback signal when the voltage of the second node falls below the threshold.

15. A method of operating a flip-flop circuit, the method comprising:

in response to a clock signal, selectively providing electrical charge from a power supply to a first node;

adjusting a voltage of a second node in response to detecting a voltage of the first node crossing a threshold while the electrical charge is being provided to the first node;

in response to the clock signal, storing a value based on a voltage of the second node;

providing the value as an output of the flip-flop circuit;

generating a delayed clock signal; and selectively connecting the second node to the power supply in response to the delayed clock signal.

16. A method of operating a flip-flop circuit, the method comprising:

in response to a clock signal, selectively providing electrical charge from a power supply to a first node;

adjusting a voltage of a second node in response to detecting a voltage of the first node crossing a threshold while the electrical charge is being provided to the first node;

in response to the clock signal, storing a value based on a voltage of the second node;

providing the value as an output of the flip-flop circuit;

generating an injection enable signal in response to the clock signal; and in response to generation of the injection enable signal, providing the electrical charge to the first node.

17. The method of claim 16, further comprising stopping generating the injection enable signal in response to the second node reaching a predetermined state.

18. The method of claim 16, further comprising:

generating a feedback signal; and stopping generation of the injection enable signal in response to generation of the feedback signal.

* * * * *